US011152061B2

(12) United States Patent
Predki et al.

(10) Patent No.: US 11,152,061 B2
(45) Date of Patent: Oct. 19, 2021

(54) SYSTEMS AND METHODS FOR WRITING AND READING DATA STORED IN A POLYMER

(71) Applicant: IRIDIA, INC., Carlsbad, CA (US)

(72) Inventors: Paul F. Predki, Carlsbad, CA (US); John Stuart Foster, New Orleans, LA (US)

(73) Assignee: IRIDIA, INC., Carlsbad, CA (US)

( * ) Notice: Subject to any disclaimer, the term of this patent is extended or adjusted under 35 U.S.C. 154(b) by 0 days.

(21) Appl. No.: 16/866,364

(22) Filed: May 4, 2020

(65) Prior Publication Data

US 2020/0265890 A1 Aug. 20, 2020

Related U.S. Application Data

(63) Continuation-in-part of application No. PCT/US2019/050021, filed on Sep. 6, 2019.

(60) Provisional application No. 62/842,373, filed on May 2, 2019, provisional application No. 62/728,656, filed on Sep. 7, 2018, provisional application No. 62/842,373, filed on May 2, 2019.

(51) Int. Cl.
*G11C 13/00* (2006.01)
*G05B 11/42* (2006.01)

(52) U.S. Cl.
CPC .......... *G11C 13/0016* (2013.01); *G05B 11/42* (2013.01); *G11C 13/004* (2013.01); *G11C 13/0019* (2013.01); *G11C 13/0069* (2013.01)

(58) Field of Classification Search
CPC ............ G11C 13/0016; G11C 13/0019; G11C 13/004; G11C 13/0069; G11C 29/74; G11C 2029/1206; G11C 29/028; G11C 29/021; G11C 29/12005; G11C 29/04; G11C 11/5664; G05B 11/42
See application file for complete search history.

(56) References Cited

U.S. PATENT DOCUMENTS

| 8,280,247 | B1 * | 10/2012 | Forsberg | ............ | H04B 10/0799 |
| | | | | | 398/27 |
| 2001/0021201 | A1 * | 9/2001 | Tanaka | .................... | H04J 3/076 |
| | | | | | 370/526 |

(Continued)

*Primary Examiner* — Jay W. Radke
(74) *Attorney, Agent, or Firm* — Hoxie & Associates LLC

(57) ABSTRACT

A system and method of storing and reading digital data, including providing a nanopore polymer memory (NPM) device having at least one memory cell comprising at least two addition chambers each arranged to add a unique chemical construct (or codes) to a polymer (or DNA) string when the polymer enters the respective addition chamber, the data comprising a series of codes; successively steering the polymer from deblock chambers through the nanopore into the addition chambers to add codes to the polymer to create the digital data pattern on the polymer; and accurately controlling the bit rate of the polymer using a servo controller. The device may have loading chamber(s) to load (or remove) the polymer into/from the deblock chambers through at least one "micro-hole". The cell may be part of a memory system that stores and retrieves "raw" data and allows for remote retrieval and conversion. The cell may store multi-bit data having a plurality of states for the codes.

20 Claims, 24 Drawing Sheets

(56) References Cited

U.S. PATENT DOCUMENTS

| | | | |
|---|---|---|---|
| 2002/0083238 A1* | 6/2002 | Naka | H04N 21/4334 |
| | | | 710/68 |
| 2003/0231743 A1* | 12/2003 | Laskowsky | H04Q 11/00 |
| | | | 379/27.01 |
| 2005/0111341 A1* | 5/2005 | Zhang | G11B 7/0033 |
| | | | 369/275.2 |
| 2006/0016516 A1* | 1/2006 | Beck | C08J 3/24 |
| | | | 148/108 |
| 2006/0215750 A1* | 9/2006 | Izawa | H04N 19/15 |
| | | | 375/240.01 |
| 2012/0033492 A1* | 2/2012 | Chen | G11C 16/10 |
| | | | 365/185.03 |
| 2017/0271028 A1* | 9/2017 | Rigal | H04N 21/42669 |
| 2019/0080760 A1* | 3/2019 | Predki | C12Q 1/68 |
| 2019/0136307 A1* | 5/2019 | Predki | C12P 19/34 |
| 2019/0383788 A1* | 12/2019 | Predki | C07H 21/04 |

\* cited by examiner

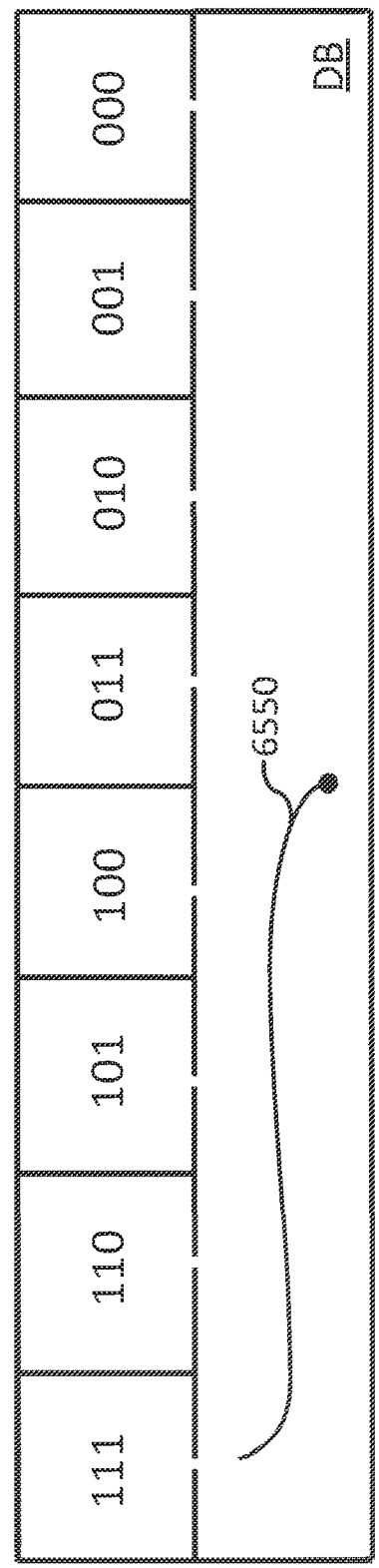

Fig. 11C

| 0111 | 0110 | 0101 | 0100 | 0011 | 0010 | 0001 | 0000 |
|------|------|------|------|------|------|------|------|
| ~6550 | | | | | | | DB |
| ~~1111~~ | 1110 | 1101 | 1100 | 1011 | 1010 | 1001 | 1000 |

Single (or up to 8) Add Chamber Failure(s)

Allows for *automatic bit number reconfiguration* on the fly, e.g., when one (or more) add chambers fail (also applies to Base reconfiguration).

Fig. 11D

| 111 | 110 | 101 | 100 | 011 | 010 | 001 | 000 |
|-----|-----|-----|-----|-----|-----|-----|-----|
| ~6550 | | | | | | | DB |
| 1111 | 1110 | 1101 | 1100 | 1011 | 1010 | 1001 | 1000 |

Works for many different add chamber configurations and numbers.

System automatically reconfigures from a 4 bit binary writing to 3-bit binary writing

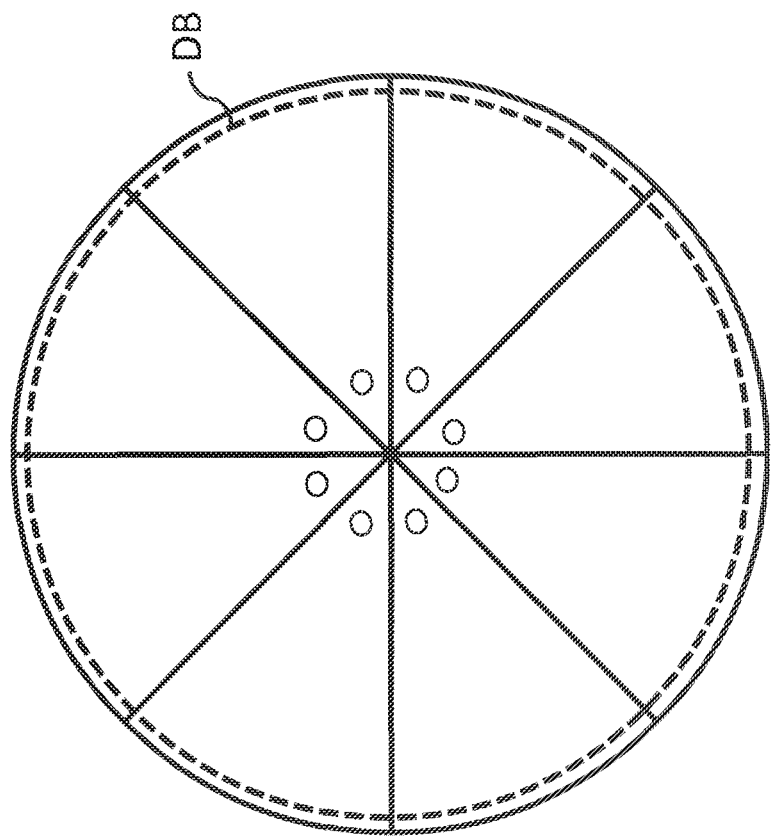

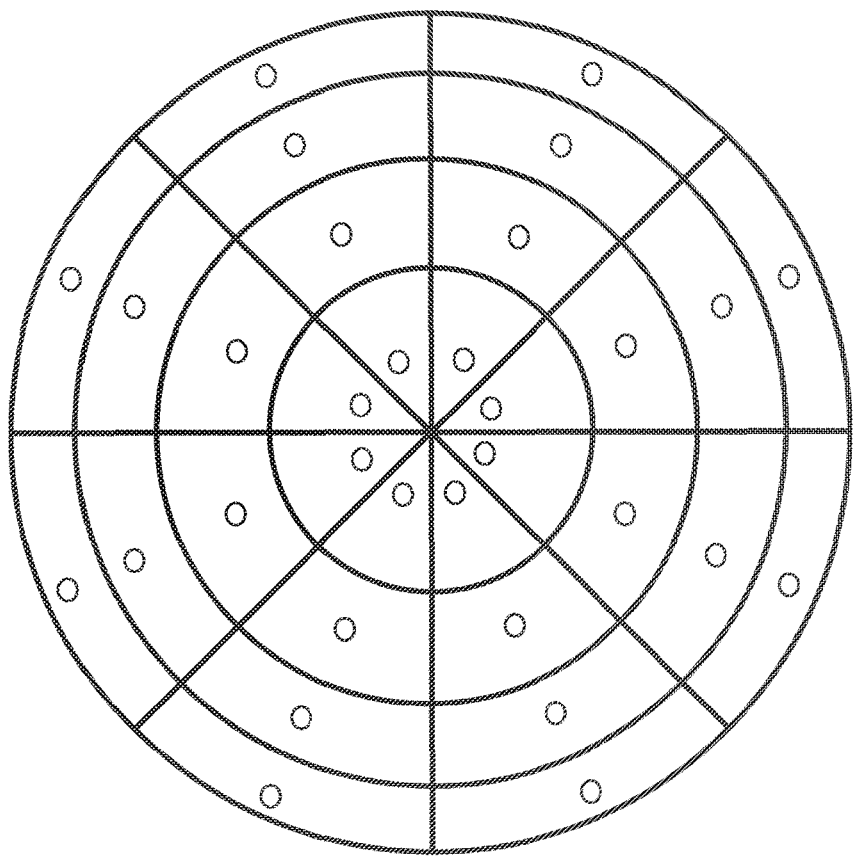

| Cell 1 (Digit 1) | Cell 2 (Digit 2) | Cell 3 (Digit 3) | ... | Cell M (Digit M) | |
|---|---|---|---|---|---|
| N ... 3 2 1 — DB1 | N ... 3 2 1 — DB2 | N ... 3 2 1 — DB3 | ... | N ... 3 2 1 — DBM | |
| 4 different values (0 to 3) | 4 different values (0 to 3) | 4 different values (0 to 3) | ... | 4 different values (0 to 3) | For: N=4 |
| 8 different values (0 to 7) | 8 different values (0 to 7) | 8 different values (0 to 7) | ... | 8 different values (0 to 7) | For: N=8 |
| 10 different values (0 to 10) | 10 different values (0 to 10) | 10 different values (0 to 10) | ... | 10 different values (0 to 10) | For: N=10 (Decimal) |
| 16 different values (0 to 15 or 0 to F) | 16 different values (0 to 15 or 0 to F) | 16 different values (0 to 15 or 0 to F) | ... | 16 different values (0 to 15 or 0 to F) | For: N=16 (Hexadecimal) |

*FIG. 12*

SYSTEMS AND METHODS FOR WRITING AND READING DATA STORED IN A POLYMER

CROSS REFERENCE TO RELATED APPLICATIONS

This application is a Continuation-in-Part of International PCT Application No. PCT/US2019/050021, filed Sep. 6, 2019, which claims the benefit of U.S. Provisional Application No. 62/842,373, filed May 2, 2019 and U.S. Provisional Application No. 62/728,656, filed Sep. 7, 2018; and also claims the benefit of U.S. Provisional Patent Application No. 62/842,373, filed May 2, 2019. The entire contents of each of the above applications are incorporated herein by reference, to the fullest extent permitted by law.

FIELD

The invention relates to novel methods and systems for information storage and retrieval, using nanopore devices.

BACKGROUND

There is a continuing demand to store ever more data on or in physical media, with storage devices getting ever smaller as their capacity gets bigger. The amount of data stored is reportedly doubling in size every two years. Moreover, existing data storage media such as hard drives, optical media, and magnetic tapes, are relatively unstable and become corrupted after prolonged storage.

There is an urgent need for alternative approaches to storing large volumes of data for extended periods, e.g., decades or centuries.

BRIEF DESCRIPTION OF THE DRAWINGS

The present invention will become more fully understood from the detailed description and the accompanying drawings, wherein:

FIG. 11A shows an 8 add-chamber memory cell and corresponding three-bit binary codes, in accordance with embodiments of the present disclosure.

FIG. 11C shows bit reconfiguration with a 16 add-chamber memory cell when an addition chamber fails, in accordance with embodiments of the present disclosure.

FIG. 11D shows alternative bit reconfiguration with a 16 add-chamber memory cell when an addition chamber fails, in accordance with embodiments of the present disclosure.

FIG. 11F shows an 8 add-chamber memory cell having a circular geometry, in accordance with embodiments of the present disclosure.

FIG. 11G shows a 64 add-chamber memory cell having a circular geometry, in accordance with embodiments of the present disclosure.

FIG. 12 shows a plurality (M) memory cells, each cell having N addition chambers, configured to create a Base-N word having M digits, in accordance with embodiments of the present disclosure.

DETAILED DESCRIPTION

The following description of the preferred embodiment(s) is merely exemplary in nature and is in no way intended to limit the invention, its application, or uses.

The following commonly-owned pending patent applications contain subject matter related to that described herein, each of which are hereby incorporated by reference in their entirety to the fullest extent permitted by applicable law: U.S. patent application Ser. No. 15/690,189, filed Aug. 29, 2017; U.S. patent application Ser. No. 15/969,745 filed May 2, 2018; and U.S. Patent Application No. 62/728,656 filed Sep. 7, 2018.

In particular, in some aspects or embodiments, the disclosure provides a system and method for storing data on a polymer in a nanopore-based device, comprising providing a "memory cell" having at least three chambers, including at least two add chambers and a "deblock"/"de-protect" chamber, each of the add chambers having a nanopore arranged to allow the polymer to enter and exit the add chamber and each of the add chambers arranged to add a unique code to the polymer when the polymer enters the respective add chamber, and the "deblock" chamber arranged to enable the polymer to receive the code when the polymer enters the respective add chamber; and successively steering the polymer from the "deblock" chamber through the nanopore to the add chambers to add the codes to the polymer based on a predetermined digital data pattern to create the digital data pattern on the polymer.

Figure 1:
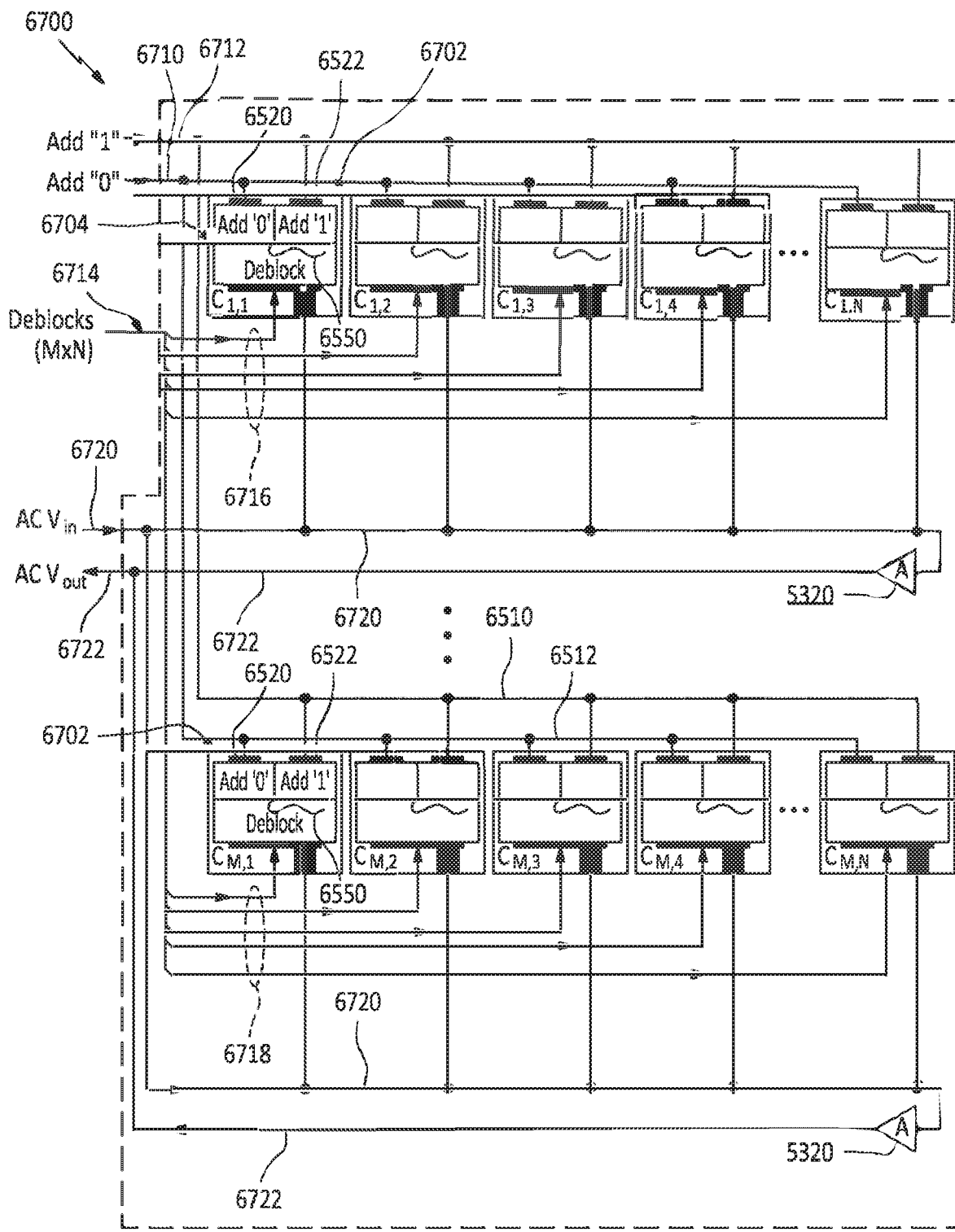
FIG. 1 is a circuit block diagram of an array of nanopore memory cells, in accordance with embodiments of the present disclosure.

Referring to FIG. 1, a schematic circuit block diagram of a nanopore-based "memory chip" 6700, is shown for embodiments of the present disclosure. In particular, the memory chip 6700 may have a plurality of nanopore-based "memory cells" 6702 (or "storage cell" or "data storage cell"), each having the ability to store data. Each of the "memory cells" 6702 has a multi-chamber nanopore-based fluidic cell 6704 with a cell structure similar to that discussed in the aforementioned patent applications (which are incorporated by reference) (e.g., having a membrane with a nanopore and a "memory string" 6550 (e.g., DNA or other polymer, as discussed in the aforementioned patent applications). The "memory cells" 6702 may also include any solid-state or semiconductor passive or active circuitry or chip layers or components, which interface with the fluidic cell portion 6704 to provide the data storage (or writing or adding) and/or data retrieval (or reading or sequencing) functions described herein.

Figure 2:
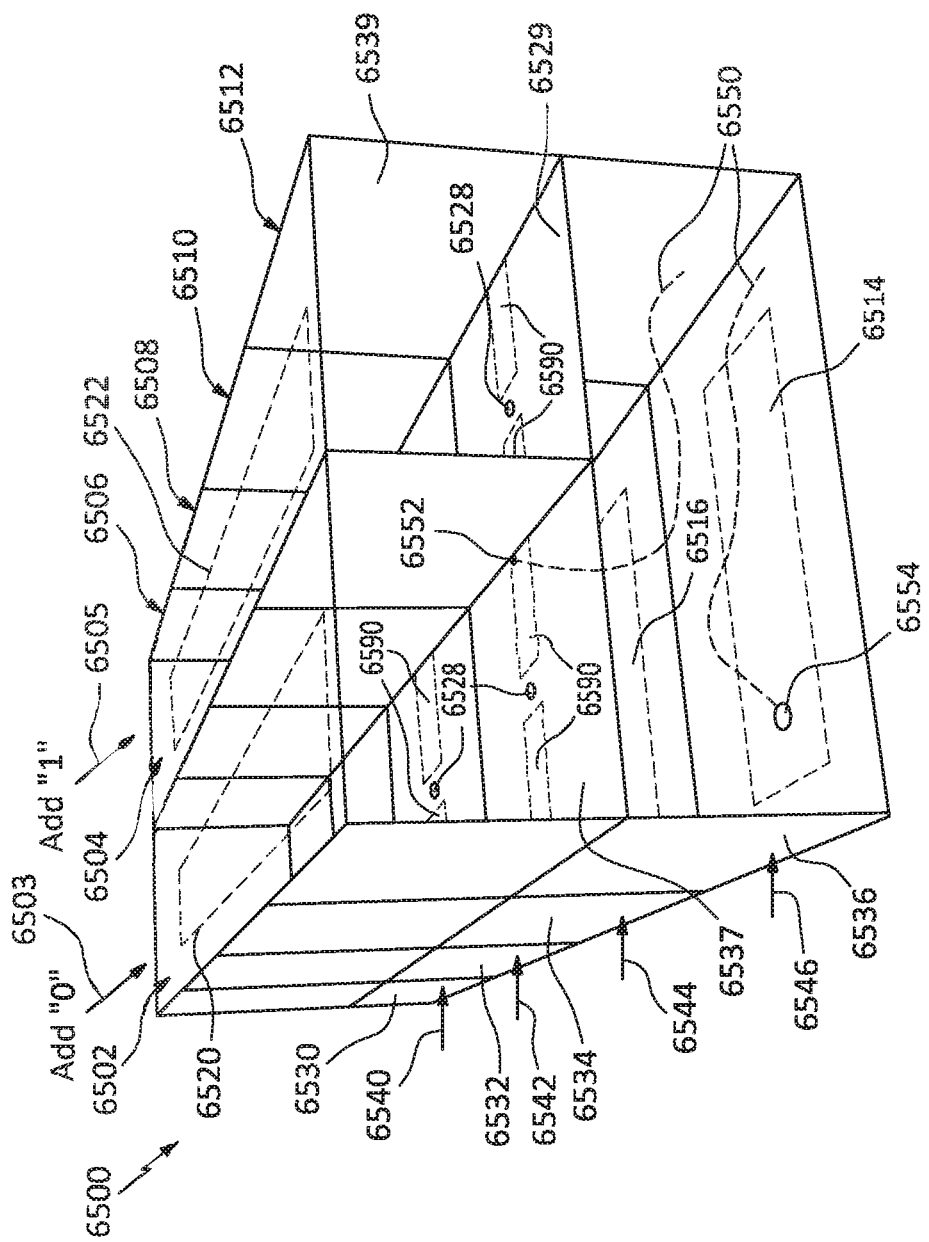
FIG. 2 is a partial perspective view of a group of connected 3-chamber cell nanopore devices having a transparent top and electrodes, in accordance with embodiments of the present disclosure.
Figure 3:
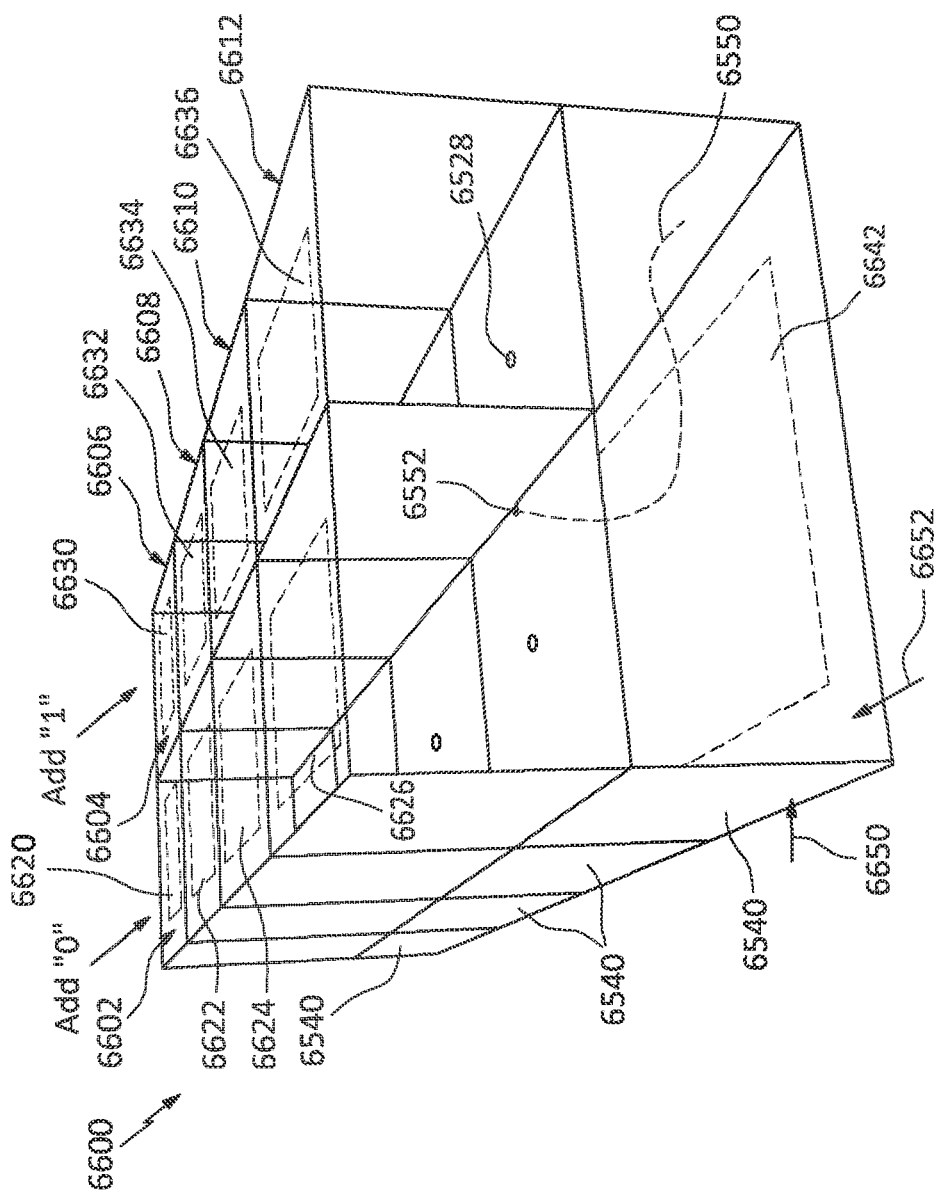
FIG. 3 is a partial perspective view of an alternative embodiment of a group of connected 3-chamber cell nanopore devices having a transparent top and electrodes, in accordance with embodiments of the present disclosure.

Referring to FIGS. 2 and 3, the memory cells 6702 may be connected together (electrically and fluidically), such as 3-chamber memory cells having common fluidic "Add" channels and common "Add" electrodes, and independent "deblock" chambers, such as is shown in FIG. 2, and also described in the aforementioned patent applications. Any number of chambers and any cell configurations described herein may be used if desired. In some embodiments, the memory cell may be configured as shown in FIG. 3, which is also described in the aforementioned patent applications.

In particular, for example, referring to FIG. 2, a partial perspective drawing having selective transparent surfaces of a grouping of 3-chamber nanopore-based cells 6500 (each cell similar to that discussed herein above), of nanopore memory chip is shown for some embodiments of the present disclosure. In particular, a group of four 3-chamber cells 6506,6508,6510,6512 are connected together, such that the upper (or top) left chambers 6502 (Add "0" chambers) of each of the connected cells 6506-6512 are fluidically connected together to form an Add "0" flow channel or Add "0" chambers 6502. In addition, the upper (or top) right chambers 6504 (Add "1" chambers) of each of the connected cells 6506-6512 are also fluidically connected together to form a separate Add "1" flow channel or Add "1" chambers 6504. In addition, the Add "0" chambers (or channel) 6502 have a common electrode 6520, and the Add "1" chambers (or channel) 6504 have a different common electrode 6522. In some embodiments there may be a single metallic or conductive strip providing the common electrode for each add channel, and in some embodiments there may be separate electrodes, which are connected by in-chip wiring.

Also, any of the embodiments and cell designs disclosed herein may be used with a longitudinal resonator design(s) (LNPR) and/or a transverse resonator design(s) (TNPR) described in detail in the aforementioned patent applications, for measurement or reading molecules structures or data. In particular, transverse resonator design(s) (TNPR), transverse electrodes 6590 may be disposed around one or more of the nanopores 6528. Also, the hardware and software logic and control logics and embodiments shown herein may also be used with the LNPR and/or TNPR configurations.

Below the collective Add channels 6502,6504, are individual "deblock" chambers 6530-6536, similar to that discussed herein above, that are both fluidically and electrically isolated from the other chambers. On the bottom of each of the deblock chambers 6530-6536 are corresponding individually controllable "deblock" electrodes, e.g., deblock electrodes 6514,6516 visible in FIG. 2 correspond to deblock chambers 6536,6534, respectively. Also, the upper chambers for the cells 6506-6512 each have a corresponding nanopore 6528 through a membrane 6529. Also, in this example, the fluidic cell 6512 has a left top Add "0" chamber 6537 and a right top Add "1" chamber 6539. While the Add "0" chambers for the fluidic cells 6502-6512 are fluidically connected via the fluidic channels 6502, and the Add "1" chambers for the fluidic cells 6502-6512 are fluidically connected via the fluidic channels 6504, each of the fluidic cells 6506-6512 has an independent memory storage string (e.g., DNA or polymer) 6550, which has one end that traverses through the nanopore 6550 to enter the Add "1" or Add "0" chambers, and returns to its corresponding deblock chamber 6530-6536, which is fluidically and electrically isolated from the other chambers (in this example). Thus, each of the 3-chamber fluidic cells 6506-6512 represents an independent memory storage cell, or memory cell (discussed more hereinafter).

As the configuration of FIG. 2 has all the Add "0" electrodes connected together and, separately, all the Add "1" electrodes connected together, and the deblock electrodes are individually controlled, the writing (or adding) may occur in write (or add) "cycles," such as an Add "0" cycle, when all the cells that need to write a "0" may be written at the same time, followed by an Add "1" cycle, when all the cells that need to write a "1" may all be written at the same time. Other data writing cycles or approaches may be used if desired.

In addition, the Add "0" and Add "1" channels 6502, 6504, may be filled with fluid (or flushed, or washed or emptied) from the front or back, as shown by the arrows 6503-6505, respectively, and the deblock chambers 6530-6536 may be filled with fluid (or flushed, or washed or emptied) from the side, as shown by the arrows 6540-6546, respectively. It is not required that every Add "1" chamber be fluidically and electrically connected or that every Add "0" chamber be fluidically and electrically connected. If a large number of them are so connected it provides efficiencies; in general, the more cells that are connected the more efficiencies that can be realized.

Also, the entire polymer (or DNA) or "string" or memory string 6550 may be prevented from completely exiting the central deblock chamber by binding (or tethering or attaching) one end of the polymer 6550 to the surface of the central deblock chamber 6536, e.g., shown as point 6552 in deblock chamber 6536. Other locations in deblock chamber 6536 may be used to tether the polymer provided it meets the desired functional and performance requirements. In some embodiments, a structure 6554, e.g., a bead, particle, or origami, or other structure, may be attached to one end of the polymer 6550 and prevent the polymer from leaving the deblock chamber 6536 through the nanopore 6550. Similar criteria apply for the polymer memory string 6550 in the other deblock chambers 6530-6534.

The polymer 6550 used to store the data may be DNA as discussed herein, or it may be any other polymer or other material that has the properties described herein. The polymer 6550 used to store data may also be referred to herein as a "memory polymer" or "memory string" (due to its string-like appearance).

Referring to FIG. 3, a partial perspective drawing having selective transparent surfaces of a grouping of 3-chamber nanopore-based cells 6600 (each cell similar to that discussed herein above), of nanopore memory chip is shown for some embodiments of the present disclosure. In particular, similar to FIG. 2, a group of four 3-chamber cells 6606, 6608,6610,6612 are connected together, such that the upper (or top) left chambers 6602 (Add "0" chambers) of each of the connected cells 6606-6612 are fluidically connected together to form an Add "0" flow channel 6602. In addition, the upper (or top) right chambers 6604 (Add "1" chambers) of each of the connected cells 6606-6612 are also fluidically connected together to form a separate Add "1" flow channel 6604. However, in this embodiment, the Add "0" chambers associated with the cells 6606-6612 have separate electrodes 6620-6626, and the Add "1" chambers associated with the cells 6606-6612 also have separate electrodes 6630-6636. In some embodiments, the upper chambers (Add "0" and Add "1") may be fluidically separated or isolated from each other to avoid potential electrical-cross talk between adjacent Add chambers when trying to control the path of the DNA.

Also, for FIG. 2, deblock chambers may be fluidically connected even though the electrodes are separately controlled. In that case, there may be cross-talk between the channels, e.g., nearby DNA gets attracted by electric fields and/or current flow seen by adjacent cells.

In some embodiments, the electrodes may be have 3D shapes, such as a triangle or pyramid rising up from the bottom of the cell or protruding down into the cell. In that case, the electrode may be constructed to produce a more targeted, focused or closer electric field to the nanopore for that cell, which may reduce cross talk between adjacent cells that are fluidically connected but electrically separated.

If the memory string (or DNA or polymer) gets so long it may wrap around from one add chamber and though the top of another. To avoid that issue, there may be partial walls disposed between adjacent cells along the flow channel, to make the distance between adjacent nanopores that much longer for long DNA.

Below the Add chambers is a common "deblock" chamber 6640, which is common to all the upper Add chambers, similar to that discussed herein above. On the bottom of the common deblock chamber 6540 is a common deblock electrode 6642. Also, the upper chambers for the cells 6606-6612 may each have the nanopore 6528, similar to that discussed herein above, through the membrane 6529.

In addition, the deblock chamber 6540 may be filled with fluid from a side (depending on the structural configuration of the cell). In some embodiments, it may be filled from the left (or right side), as shown by the arrow 6650. In other embodiments, it may be filled from the front (or back) side, as shown by the arrow 6652.

Also, the entire DNA or polymer "string" (or memory string) 6550 may be kept from completely exiting the central deblock chamber by binding (or tethering) one end of the polymer 6550 to the surface of the central deblock chamber 6640, e.g., shown as point 6552 for the cell 6612. A similar arrangement would apply for the other cells 6606-6610. Other locations may be used to tether the polymer provided it meets the desired functional and performance requirements.

Referring to FIG. 1, the "memory cells" 6702 may be configured as an M×N array of memory cells, with M rows and N columns, each of the cells 6702 being labeled $C_{M,N}$. More specifically, the cells 6702 in the first row are labeled $C_{1,1}$-$C_{1,N}$, and the cells 6702 in the last row are labeled $C_{M,1}$-$C_{M,N}$. M and N may be any values that provide the desired functions and performance, and M,N may each be as small a 1 and as large as 1 million, 10 million, 100 million, 1 billion, or 1 trillion, or larger, depending on the desired footprint size of the memory chip and the size of each memory cell.

The memory chip 6700 has an Add "0" input DC voltage on line 6710, which is electrically connected (directly or through on-chip circuitry or components, as described herein) to each of the Add "0" electrodes. The Add "0" input DC voltage on the line 6710 drives the Add "0" electrode to the desired voltage state (discussed herein), to help position (or move or steer) the memory string 6550 (DNA or other polymer, as discussed herein) to the desired chamber of the fluidic cell 6704. In this configuration, all the Add "0" electrodes for each of the memory cells are shared or common, or electrically connected, as shown in FIG. 2.

The memory chip 6700 also has an Add "1" input DC voltage on line 6712 which is electrically connected (directly or through on-chip circuitry or components as described herein) to each of the Add "1" electrodes. The Add "1" input DC voltage on the line 6710 drives the Add "1" electrode to the desired voltage state (discussed herein), to help position (or move or steer) the memory string 6550 (DNA or other polymer, as discussed herein) to the desired chamber of the fluidic cell 6704. In this configuration, all the Add "1" electrodes 6522 for each of the memory cells is shared or common, as shown in FIG. 2.

The memory chip 6700 also has a "Deblock" input DC voltage on a plurality of lines (or bus) 6714, each of which is electrically connected (directly or through on-chip circuitry or components as described herein) to a corresponding "deblock" electrode in each of the cells 6702. The deblock input DC voltage drives the corresponding deblock electrode for a given cell to the desired voltage state (discussed herein), to help position (or move or steer) the memory string 6550 (DNA or other polymer, as discussed herein) to the desired chamber of the fluidic cell 6704. In this configuration, each of the deblock electrodes are independently driven, as shown in FIG. 2, thus the need for the deblock plurality of electrical connections or bus (or deblock bus) 6714. Each row of memory cells 6702 will have a corresponding number of deblock input DC voltage lines provided. For example, the first row there is a set of N deblock lines 6716 feeding the N cells 6702 in that row, and in the last row M, there is a separate set of N deblock lines 6718 feeding the N cells 6702 in the row M.

The DC input voltages Add "0", Add "1", and deblock, on the lines 6710, 6712, 6714, respectively, may be referred to herein as DC "steering" voltages $V_{ST}$ (or polymer or DNA steering voltages or memory string steering voltages) as they are used to "steer" the polymer memory string to the appropriate chamber of the fluidic cell 6704 at the appropriate time to achieve the desired result, e.g., write or add a "0" or "1" onto the memory string, or do nothing, or move the memory string to a particular chamber to enable writing or reading data, or perform validation testing, or the like. DC input voltages Add "0", Add "1", and deblock, on the lines 6710, 6712, 6714, respectively, may be provided from a computer-based controller circuit or logic or device, as described herein, which has the appropriate logic to perform the functions described herein.

The memory chip 6700 also has an AC input voltage Vin, and an AC output voltage Vout, on line 6720, 6722, respectively. The AC input voltage Vin on the line 6720 is electrically connected, as described herein, to each of the memory cells 6702 in parallel. The AC Vin provides an AC signal, e.g., rf or radio frequency signal, on the line 6720 to each of the memory cells 6702 and the memory cells are configured to be a resonator or nanopore polymer resonator (NPR), each having a different frequency response to the input AC Vin, as discussed in the aforementioned patent applications. The line 6720 may connect the memory cell 6702 and/or the electronic components on the chip, the electrodes, and the fluidic cell 6704 therein, differently from that shown in FIG. 1, depending on the circuit configuration used for the nanopore polymer resonator (NPR), fluidic cell configuration, electrode configuration, or other factors, as described herein. The AC input voltage Vin on the line 6720 may be provided from a computer-based controller circuit or logic or device, as described herein, which has the appropriate logic to provide the appropriate AC input voltage Vin and perform the functions described in the aforementioned patent applications.

The combined frequency response from each of the memory cell 6702 may be provided to an on-chip amplifier (or pre-amp) 5320 (as described in the aforementioned patent applications with regard to FIG. 53 therein), which provides the AC output voltage Vout on the line 6722 indicative of the combined frequency response. The AC output voltage Vout on the line 6722 may be provided to a computer-based processing circuit or logic or device, which has the appropriate logic, e.g., analog-to-digital (A/D) conversion and digital signal processing (DSP) logic, as described herein, which reads the data stored on the memory string 6550 and may perform other functions as described in the aforementioned patent applications. Other reading techniques may be used if desired, such as dc bias current measurement, as described in the aforementioned patent applications.

In some embodiments, the nanochips can be fabricated for example as depicted in FIGS. 23-29 in the aforementioned patent applications. For example, in one format, each polymer strand is associated with two or four addition chambers, wherein the two addition chamber format is useful for encoding binary code in the polymer, and the four addition chamber format is particularly useful for making custom DNA sequences. Each addition chamber contains a separately controllable electrode. The addition chambers contain reagents to add monomers to the polymer in buffer. The addition chambers are separated by a membrane comprising one or more nanopores from a reserve chamber, which may be common to multiple addition chambers, and which contains deprotection reagents and buffer, to deprotect the protected monomers or oligomers added in the addition chambers. The nanochips comprise a multiplicity of addition chamber sets, to allow parallel synthesis of many polymers.

In some embodiments, the present disclosure provides a method for storing and reading data on a polymer in situ in a nanopore-based chip, comprising: providing a cell having at least three chambers, including an Add "1" chamber arranged to add a "1" bit to the polymer and an Add "0" chamber arranged to add a "0" bit to the polymer, and a "deblock" chamber arranged to enable the polymer to receive the "1" bit and "0" bit when the polymer enters the Add "1" or Add "0" chambers, respectively; successively steering the polymer from the "deblock" chamber through the nanopore to the Add "1" chamber or to the Add "0" chamber based on a predetermined digital data pattern to create the digital data pattern on the polymer; and reading the digital data stored on the polymer as it passes through the nanopore using a resonance frequency response of a nanopore-polymer resonator (NPR) on the chip, or a dc bias current change or other detection technique, which are described in the aforementioned patent applications, or any other detection technique.

Figure 4:
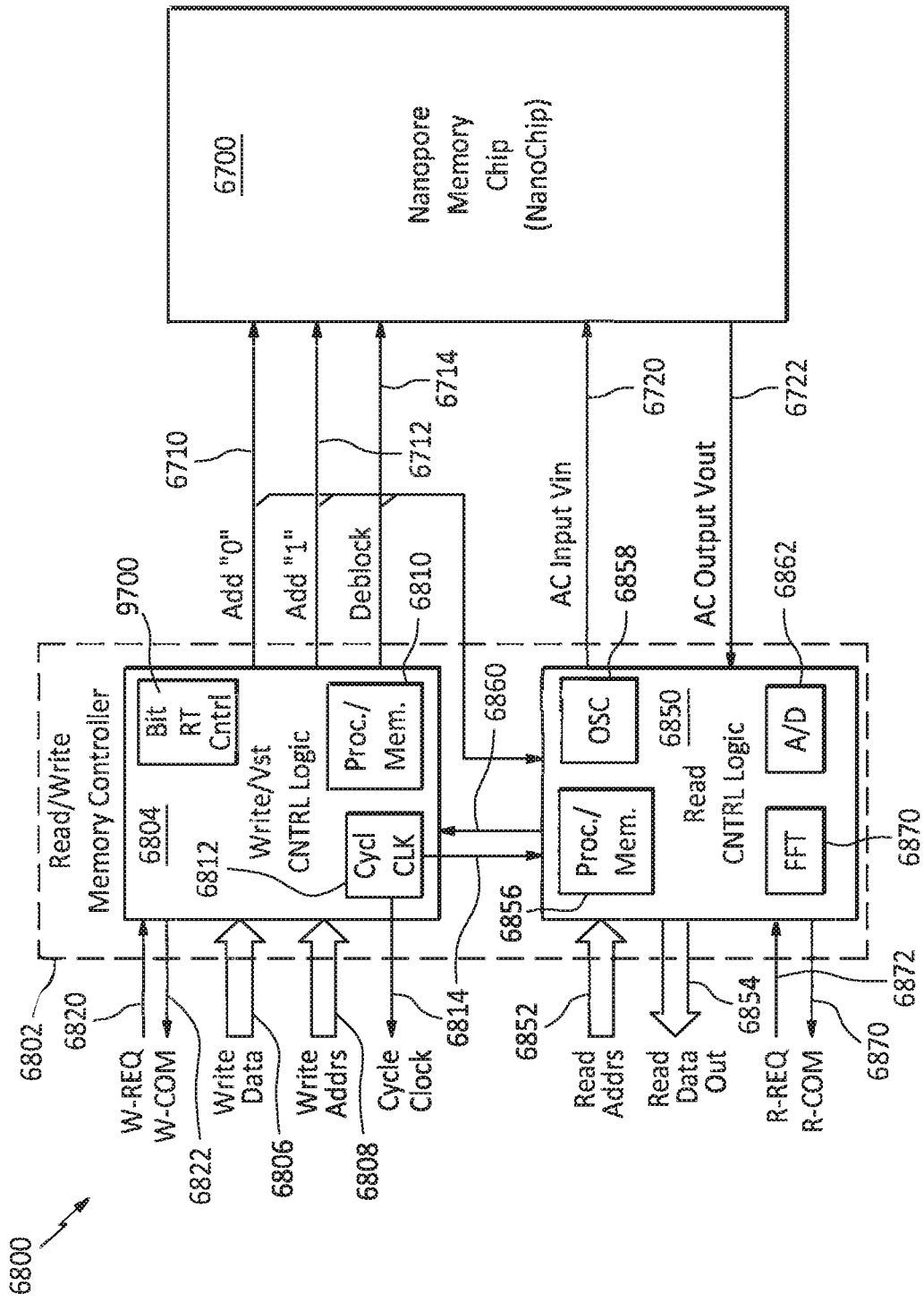
FIG. 4 is a block diagram of a read/write memory controller and a nanopore memory chip, in accordance with embodiments of the present disclosure.

Referring to FIG. 4, a top level hardware block diagram is shown of a read/write memory storage system 6800 having the nanopore-based memory chip 6700 (FIG. 1) and a memory read/write controller 6802, in accordance with embodiments of the present disclosure and as described in the aforementioned patent applications. In particular, the memory read/write controller 6802 may have a write controller logic 6804, which receives input data to be written to the memory chip 6700 on lines and an address to store the data (or label or pointer or the like) on lines 6808, and provides the DC steering voltages Add "0", Add "1", and deblock, on the lines 6710, 6712, 6714, respectively, to the nanopore memory chip 6700. The write controller 6804 has the appropriate hardware, software and firmware (including any microprocessor or micro-computer based processor chips or devices and/or memory storage) as needed to provide the functions described herein, as indicated by a Proc./Mem. box 6810.

In addition, the write controller 6804 may also provide a write (or add) cycle clock 6812 (or oscillator), which determines when the memory chip 6700 writes (or adds or stores) "0" or "1" bits. In particular, the write controller chip 6804 provides the DC steering voltages (Add "0", Add "1", Deblock) based on the write cycle clock 6812 to cause the memory chip 6700 to write "1" or "0" to the memory cells. As discussed herein above with FIG. 2, in certain cell configurations, such as when all the Add "0" electrodes are connected together and, separately, all the Add "1" electrodes are connected together, and the deblock electrodes are individually controlled (such as in FIG. 2), the writing (or adding) of data bits may occur in write (or add) "cycles," such as an Add "0" cycle, when all the cells that need to write a "0" may be written at the same time, followed by an Add "1" cycle, when all the cells that need to write a "1" may all be written at the same time. The write cycle clock provides a write cycle signal on a line 6814 to enable the write requesting device or platform or computer bus, to determine the writing status of the memory chip. Other data writing cycles, timing, or approaches may be used if desired.

In some embodiments, the write controller 6804 may also receive control signals from the system or computer bus, such as a Write Request (W-REQ) signal on a line 6820 to request certain data be written to the memory chip 6700, and the write controller 6804 may also provide a Write (or Add) Complete (W-COM) signal on a line 6822, to indicate when the requested data has been written to the memory chip 6700.

The memory read/write controller 6802 may also have memory read controller logic 6850, which may receive a read address (or label or pointer or the like) on lines 6852 corresponding to the storage location of the data desired to be read from the memory chip 6700, and provides the requested data read from the memory chip 6700, on the lines 6854. The read controller 6850 may also have the necessary logics and components to provide the AC input voltage signal Vin to the memory chip 6700 on the line 6720. The AC input voltage Vin, as described herein, is an AC rf (radio frequency) signal that has frequency components corresponding to the bandwidth of the nanopore resonators (NPRs) in the memory chip 6700. To provide the Vin signal, the read controller 6850 may have a frequency oscillator logic 6858 (programmable or non-programmable), which provides the necessary frequency components (discussed herein) to enable the read controller logic to read the requested data from the nanopore memory chip 6700. As discussed herein, the AC Vin signal may be directly synthesized, combine multiple probe frequencies, and may be a single broadband signal, or a time swept or stepped frequency signal, or any other AC signal the provides the functions described herein as described in the aforementioned patent applications.

The read controller 6850 also receives the output AC Vout voltage from the memory chip 6700 on the line 6722, and performs A/D conversion and digital signal processing (e.g., using on-board A/D conversion logic 6862 and FFT (fast Fourier transform) logic 6864), as discussed herein or in the aforementioned patent applications, on the Vout signal to determine the values of the desired data at the specified read address and provide the output data on Read Data Out the lines 6854.

The read controller 6850 has the appropriate hardware, software and firmware (including any microprocessor or micro-computer based processor chips or devices and/or memory storage) as needed to provide the functions described herein or as described in the aforementioned patent applications, as indicated by a Proc./Mem. box 6856.

In addition, the read controller 6850 may also receive the write (or add) cycle clock signal on the line 6814 from the write cycle clock 6812 (or oscillator), which, as discussed above, determines when the memory chip 6700 will write (or add or store) "0" or "1" bits. In particular, controller chip 6804 will provide the DC steering voltages (Add "0", Add "1", Deblock) based on the write cycle clock 6812 to cause the memory chip 6700 to write "1" or "0" to the memory cells. Because the act of writing with the present disclosure requires the DNA (or polymer or memory string) to pass through the nanopore to enter the desired chamber to Add bits and also to pass through the nanopore when exiting back to the deblock chamber, the write cycle clock signal may also be used by the read controller 6850 to determine when is the best time to read the data, as discussed with FIG. 69 in the aforementioned patent applications.

In some embodiments, the read controller may provide a read signal 6860 to the write controller 6804 to request the controller 6804 provide the necessary steering voltages (Add "0", Add "1", Deblock) on the lines 6710-6714 to cause the memory string 6550 (FIG. 1) to pass through the nanopore to enable reading of the memory string.

In some embodiments, the read controller 6850 may also receive a Read Request (RD-REQ) signal on a line 6870 to request certain data be read from the memory chip 6700, and the read controller 6850 may also provide a Read Complete (RD-COM) signal on a line 6822, to indicate when the requested data has been read from the memory chip 6700. The Memory Controller 6802 may perform only one function, e.g., read or writing to the nanopore chip if desired, or it may perform both of these functions (Read and Write), if desired.

Figure 5:
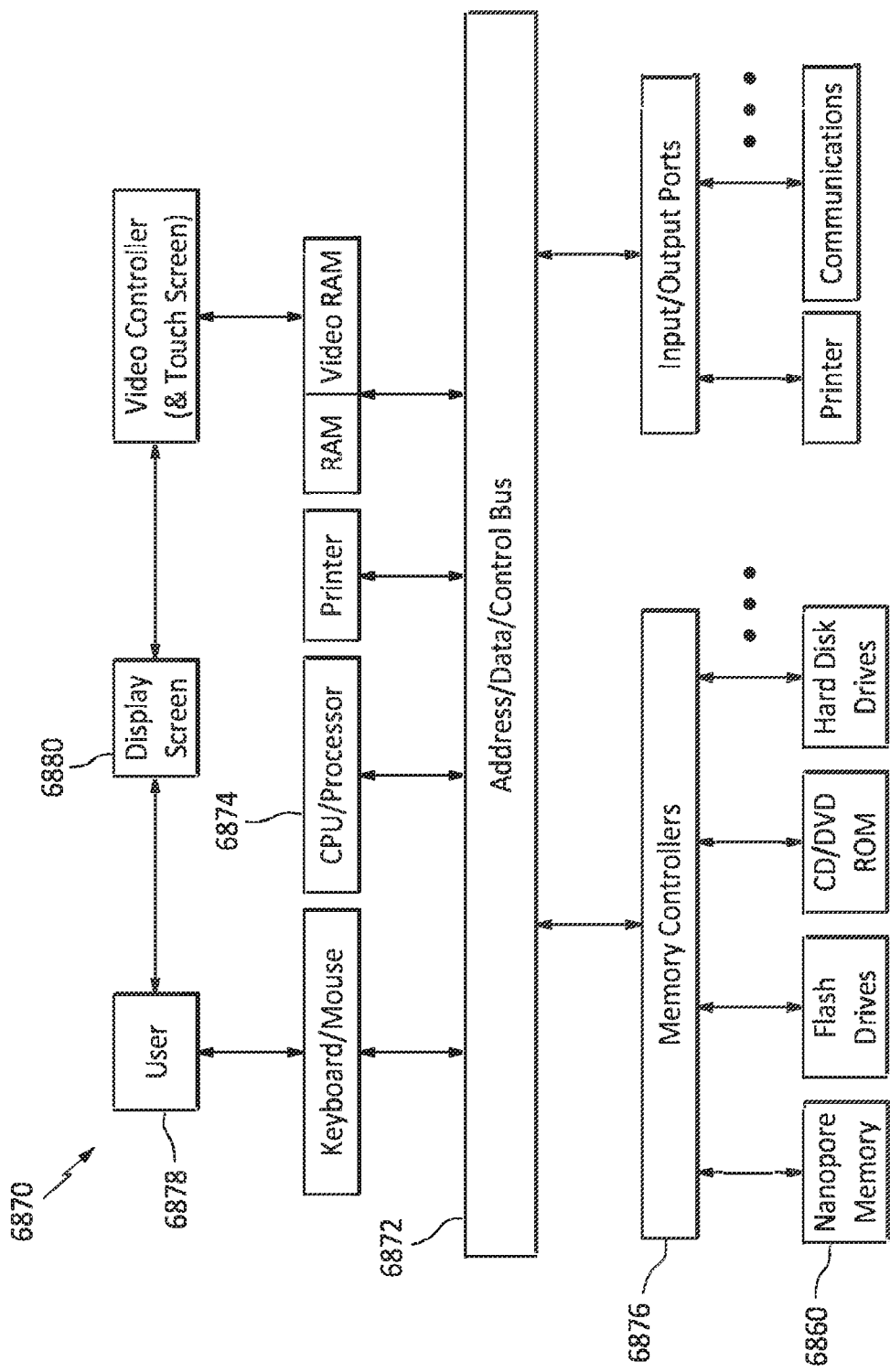
FIG. 5 is a block diagram of a computer system, in accordance with embodiments of the present disclosure.

Referring to FIG. 5, the Nanopore memory system 6800 may be part of a larger computer system which may interact with an Address/Data/Control Bus 6870, and may also interact with separate memory controllers 6876, all of which interact with one or more CPU/Processors 6874. For example, one or more of the read/write address and/or data inputs, outputs and/or control lines, such as numerals 6820, 6822, 6806, 6808, 6814, 6852, 6854, 6872, 6870, shown in FIG. 4, may be received from or provided to the bus 6872 or the memory controller 6876. The computer system 6870 may interface with a user 6878 and a display screen 6880.

Figure 6:
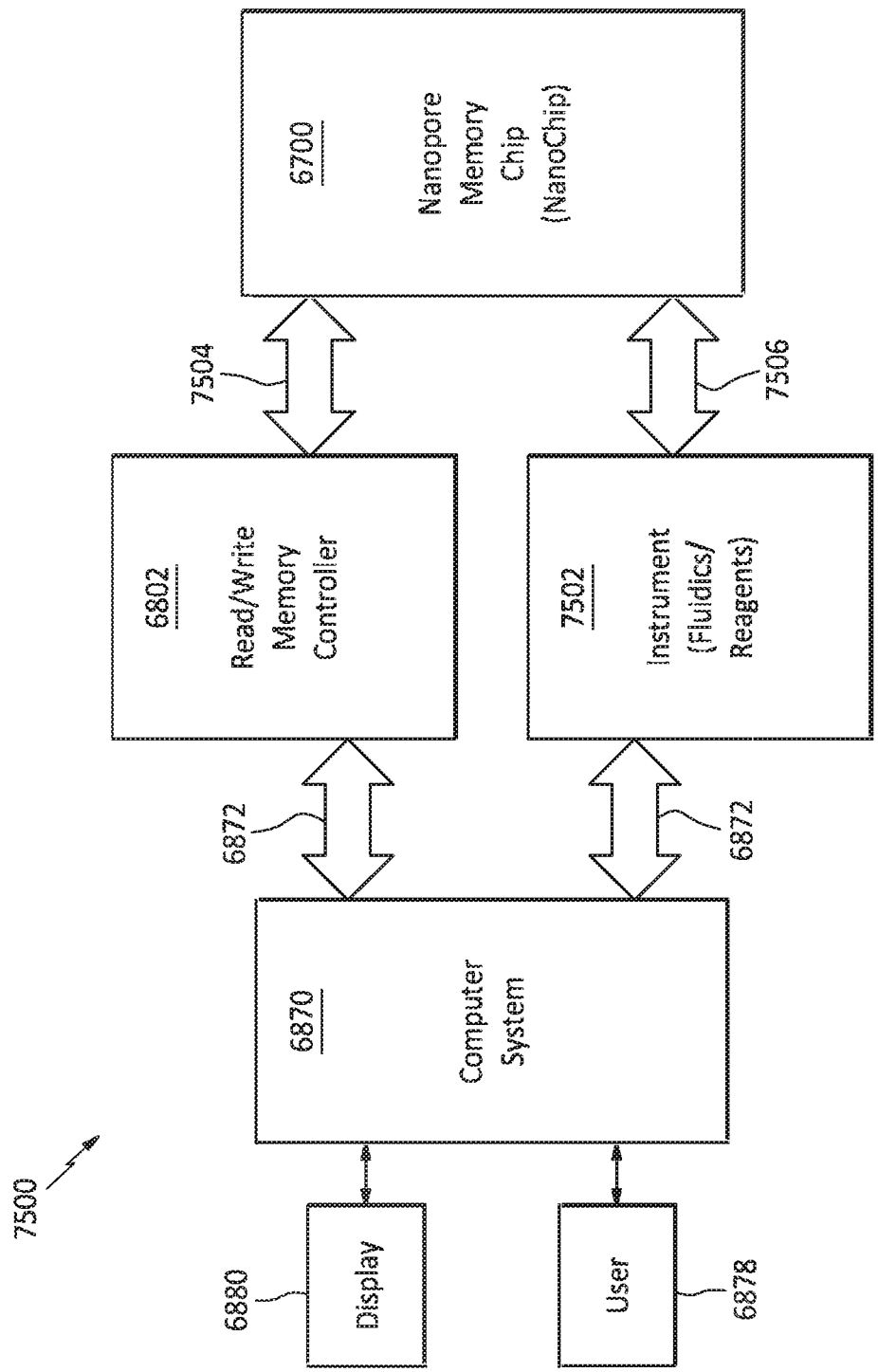
FIG. 6 is a block diagram showing a nanopore memory system showing a read/write memory controller and an instrument for fluidics/reagents, in accordance with embodiments of the present disclosure.

Referring to FIG. 6, the nanopore chip 6700 (FIG. 1) may interact with the read/write memory controller 6802, as discussed herein above with FIG. 4, as part of an overall storage system 7500, which may control the voltages (AC and DC) to steer or control the polymer to Add bits and or read the bits on the memory string as shown collectively by lines 7504. The memory chip 6700 may also interface with an instrument 7502 on lines 7506, which may provide fluidics to the memory chip, such as filling the chip with buffers, enzymes, and/or polymers or DNA (or other memory strings), as discussed herein. The Instrument 7502 and the Memory Controller 6802 may be controlled or receive commands from a Computer System 6870, such as that described and shown with FIG. 5, that may interact with the user 6878 and may have the display 6880. The computer system 6870 may interact with the Read/Write Memory Controller 6802 and the Instrument 7502 via the computer bus 6872 (FIG. 4). The instrument 7502 has the necessary electronics, computer processing power, interfaces, memory, hardware, software, firmware, logic/state machines, databases, microprocessors, communication links, displays or other visual or audio user interfaces, printing devices, and any other input/output interfaces, including sufficient fluidic and/or pneumatic control, supply and measurement capability to provide the functions or achieve the results described herein.

In particular, the instrument may perform the following fluidic actions with the memory chip: initially fill the chip with the necessary fluids, enzymes, reagents, DNA, or the like through capillary action & or micro pumping. For the embodiments where the Add1 and Add0 have flow-through channels and deblock as isolated chambers, the deblock chambers could be filled en-masse (via capillary action) first, then sealed—water and buffers would travel into the add chambers which could then be filled with their enzymes/buffers OR deblock chambers could be individually filled via targeted addition (e.g., ink-jet) and dried and sealed. In that case, the Add chambers may be filled under vacuum to ensure no bubbles get trapped in the deblock chamber, or the deblock chambers may be sealed with a material which allows gas but not water to pass through (such as PDMS). Also, the deblock chambers may be filled by leaving the bottom of the cell open during assembly, and placing the cell bottom in the desired fluid, and the fluid will wick up into the deblock chambers by capillary action.

There are various fluidics designs that will achieve the desired results for fluidic filling and flushing. For example, the Add "0" channels and Add "1" channels may respectively be connected together (like channels together) in a continuous serpentine (back and forth) pattern, and fed fluid through vias from a layer above the channels. The vias may connect to the instrument via standard fluidic interfaces sufficient to supply the desired fluids to the channels. In some embodiments, the Add channels may each be fed through separate vias from a common reservoir for Add "0" channels and from a separate common reservoir for Add "1"

channels located on a layer above the channels. Any other fluidic design may be used if desired. Sample dimensions for the Add channels, are: width about 100 nm to about 10 microns, height of about 1 micron to about 50 microns, and length of about 100 mm (1 cm or 1000 microns) from one side of the chip to the other. A serpentine connected channel would be a multiple of this depending on how many channels are connected in series. The nanopore may have a diameter of about 2-20 nm, e.g. about 2 to about 10 nm, for example about 2 to about 5 nm. Other diameters may be used if desired provided it provides the desired function and performance.

The instrument 7502 may also be used during initialization and cell testing if desired. For example, for cell initialization & cell testing Quality Control (QC) for nanopore quality to ensure expected current is observed (current proportional to pore size). Also, QC for DNA presence: ensure that the expected current (or capacitance or impedance, or shift in magnitude or phase of the resonance, as discussed herein) changes characteristic of DNA (or polymer, etc.) moving though the nanopore (e.g., expected reduction in current, or shift in magnitude or phase of the resonance, as discussed herein). In addition, it may be used for QC for circuit formation which would be similar to that performed for nanopore quality.

The instrument 7502 may also be used for DNA addition, as previously described herein, where DNA with origami is introduced via one of the add chambers (or channels), current may be applied to cells until insertion is detected, modified DNA end in deblock chamber diffuses and then attaches to surface, and restriction enzyme introduced to add chamber to cleave origami which is then removed via buffer flow. For example, the present disclosure provides DNA synthesis wherein the DNA is single or double stranded, at least 1000 nucleotides long, e.g., 1000-1,000,000 nucleotides or, for example, 5,000 to 20,000 nucleotides long, wherein the sequence of the nucleotides corresponds to a binary code. Other DNA lengths may be used if desired.

Also, the present disclosure provides for DNA (or polymer) wherein the nucleotides in a single strand or in the coding strand are selected from adenine, thymine and cytosine nucleotides, e.g., are selected from adenine and cytosine nucleotides or thymine and cytosine nucleotides. Also, the DNA may consist primarily of nonhybridizing nucleotides, so that it will not form significant secondary structures when in the form of a single strand. Also, it provides DNA wherein the nucleotides are at least 95%, e.g., 99%, e.g., 100% adenine and cytosine nucleotides. Also, the present disclosure provides DNA comprising a nucleotide or sequence of nucleotides added to separate or punctuate the nucleotides comprising a binary code, e.g., to separate the 1's and 0's or groups of 1's and 0's, so that consecutive 1's or 0's can be more easily read. The present disclosure also provides DNA wherein (a) each bit in the binary code corresponds to a single nucleotide, e.g. each of 1 and 0 correspond to A or C; or (b) each bit in the binary code corresponds to a series of more than 1 nucleotides, e.g. 2, 3 or 4 nucleotides, e.g., AAA or CCC. In addition DNA may be crystallized, or provided in a dry form together with one or more of a buffer salt (e.g., a borate buffer), an antioxidant, a humectant, e.g. a polyol, and optionally a chelator, for example as described in U.S. Pat. No. 8,283,165 B2, incorporated herein by reference; and/or in a matrix between the nucleic acid and a polymer, such as poly(ethylene glycol)-poly(l-lysine) (PEG-PLL) AB type block copolymer; and/or together with a complementary nucleic acid strand or a protein that binds the DNA.

Also, the DNA (or polymer) may contain an identifying sequence, or DNA that contains PCR amplification sequences, or the DNA may contain one or more calibrating sequences, e.g., known sequences of nucleotides which can be used to calibrate a nanopore-based sequencing device, e.g. to measure the speed of the DNA passage through the nanopore or the relative effect on capacitance or current attributable to different nucleotides passing through the nanopore. Also, the DNA may contain a terminal linker group enabling it to be anchored to a surface near the nanopore in a nanopore-based device, a spacer sequence long enough to permit the DNA strand to reach the nanopore when anchored to a surface, a data storage sequence wherein the sequence encodes data, codons or other information, and optionally a restriction sequence, enabling the DNA to be cleaved and retrieved once synthesized.

Figure 7:
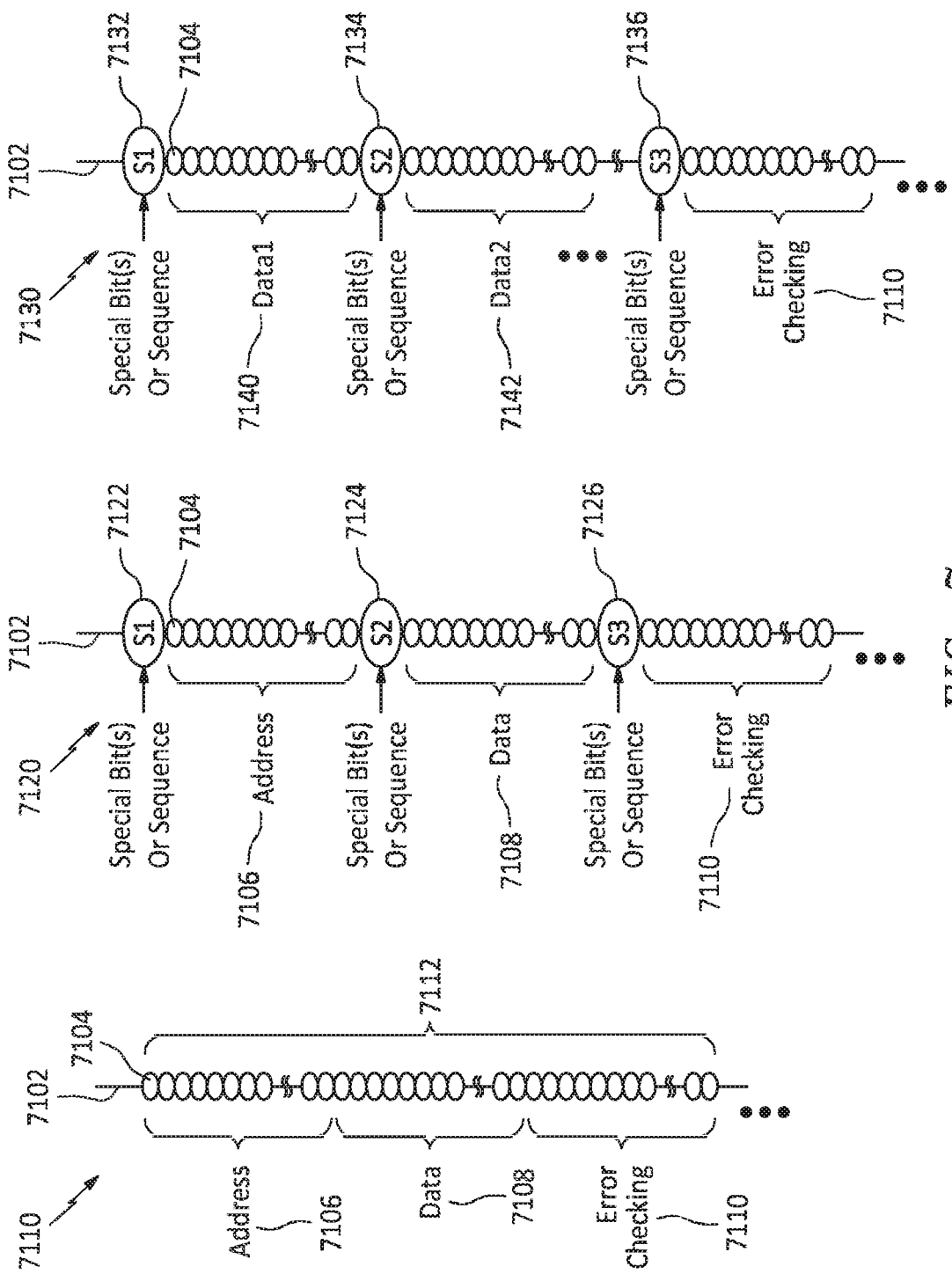
FIG. 7 shows three different data format listings of the bits on a memory string, in accordance with embodiments of the present disclosure.

Referring to FIG. 7, the format of how data is stored may vary based on various factors and design criteria. In particular, the "memory string" (or DNA or polymer) 6550 may be shown as a line 7102 on which are a series of ovals 7104, indicative of individual "bits" written (or added) onto the memory string 6550 in a given memory cell. In some embodiments, the bits 7104 may be written one after the other to build a "storage word" 7112. A first example data format 7110 shows three components to the storage word 7112, an address section 7106, a data section 7108, and an error checking section 7110. The address section 7106 is a label or pointer used by the memory system to locate the desired data. Unlike traditional semiconductor memory storage where hardware address lines on a computer memory bus would address a unique memory location, the memory chip and system of the present disclosure require the address (or label) to be part of the data stored and indicative of where the data desired to be retrieved is located. In the examples shown in FIG. 7, the address is located proximate to or contiguous with the data, as well as error checking data, such as parity, checksum, error correction code (ECC), cyclic redundancy check (CRC), or any other form of error checking and/or security information, including encryption information. In the storage word 7112, each of the components Address 7106, Data 7108, Error Checking 7110, are located after each other in the memory string. As each of the components have a known length (number of bits), e.g., address=32 bits, data=16 bits, error check=8 bits, each storage word 7112 and its components can be determined by counting the number of bits.

Another example data format 7120 shows the same three components, address section 7106, data section 7108, and error checking section 7110. However, in between each of the sections there is a "special bit(s) or sequence" sections S1,S2,S3, shown as numerals 7122,7124,7126, respectively. These special bits S1,S2,S3 may be a predetermined series of bits or code that indicate what section is coming next, e.g., 1001001001 may indicate the address is coming next, whereas 10101010 may indicate the data is coming next, and 1100110011 may indicate the error checking section in next. In some embodiments, the special bits may be a different molecular bit or bit structure attached to the string, such as dumbbell, flower, or other "large" molecular structure that is easily definable when it passes through the nanopore. Instead of it being large it may have other molecular properties that provide a unique change the capacitance or resonance different from the 1 bits and 0 bits, as discussed herein above.

Another example data format 7130 shows only Data components 7140 with no address component, and an error checking component 7110. In this structure, the string holds only the "Data" components and no Address components, which may be stored in other strings, as discussed hereafter. In this example there are also Special bits S1,S2,S3, shown as numerals 7132,7134,7136, respectively. Similar to the example 7120, these special bits S1,S2,S3 may be a predetermined series of bits or code that indicate the separation between data sections (e.g., the beginning or end of a data string or data section) and indicate when an error checking section is next, or may be a different molecular bit or bit structure attached to the string that is easily definable (or identifiable) when it passes through the nanopore, as discussed herein above.

Figure 8:
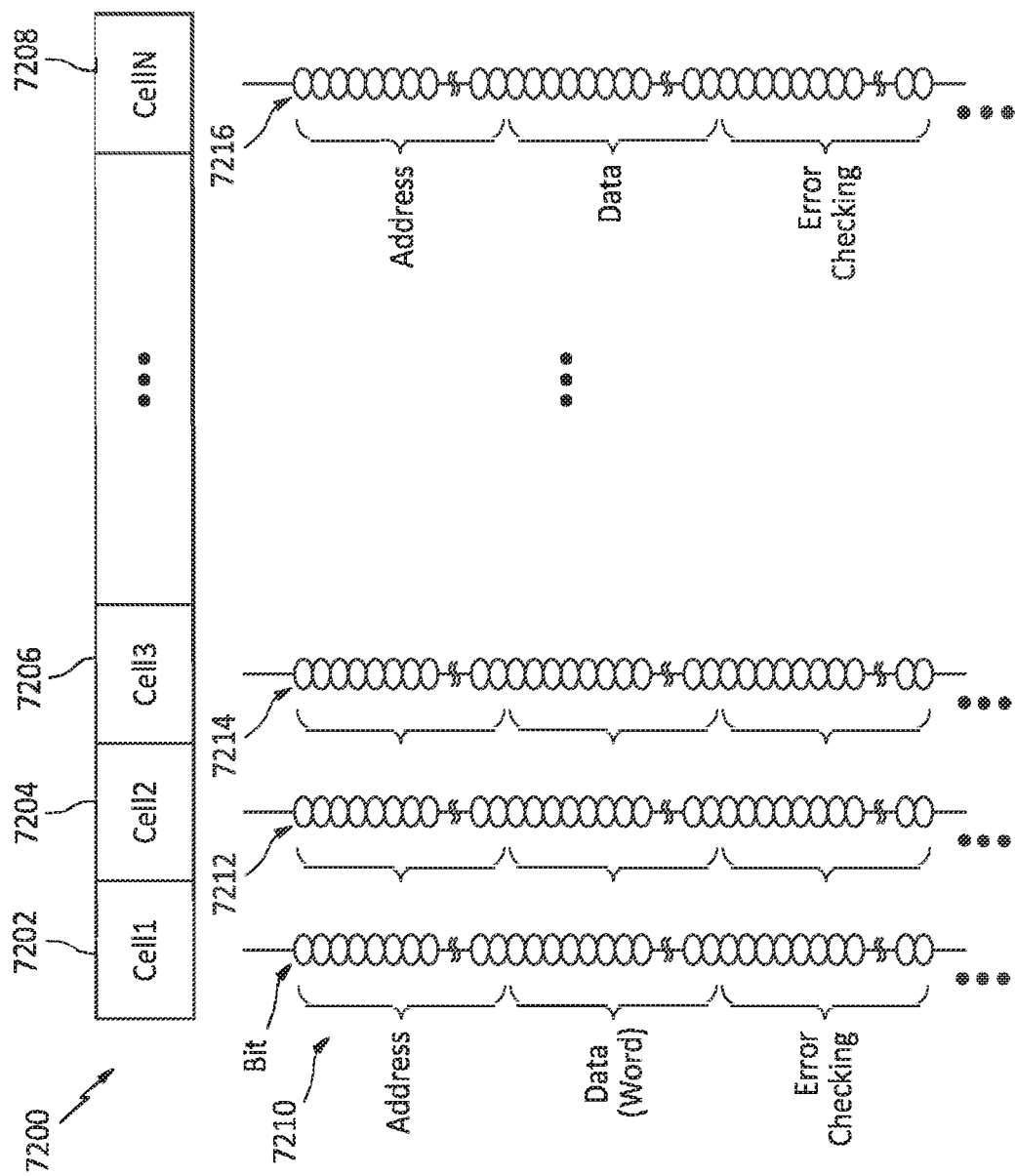
FIG. 8 shows a data format listing of the bits on a memory string for each cell in a row, in accordance with embodiments of the present disclosure.

Referring to FIG. 8, a single row of memory cells 7202-7208 (Cell1 to CellN) is shown, with a sample memory string 7210-7216, respectively, associated with each cell. The memory system of the present disclosure is significantly different from traditional semiconductor memory because instead of each memory cell storing a single bit of information (1 or 0), each memory cell of the present disclosure can store a significant amount of data (i.e., a "string" of data or "data string" or "memory string"). Thus, if a traditional semiconductor memory is viewed as a 2D array, the present memory system may be viewed as a 3D array, where each memory cell location in the memory cell array has significant storage depth. This provides a large range of options for how to store data and retrieve data.

For the example shown in FIG. 8, each cell may store a linear self-contained string of information (storage word), similar to that discussed in the example 7110 of FIG. 7. In that case, each storage word is stored back-to-back on top of (or sequentially with) other storage words along the memory string. And each of the cells 7202-7208 in the row replicates this structure, and this may be repeated for multiple rows (not shown).

Figure 9:
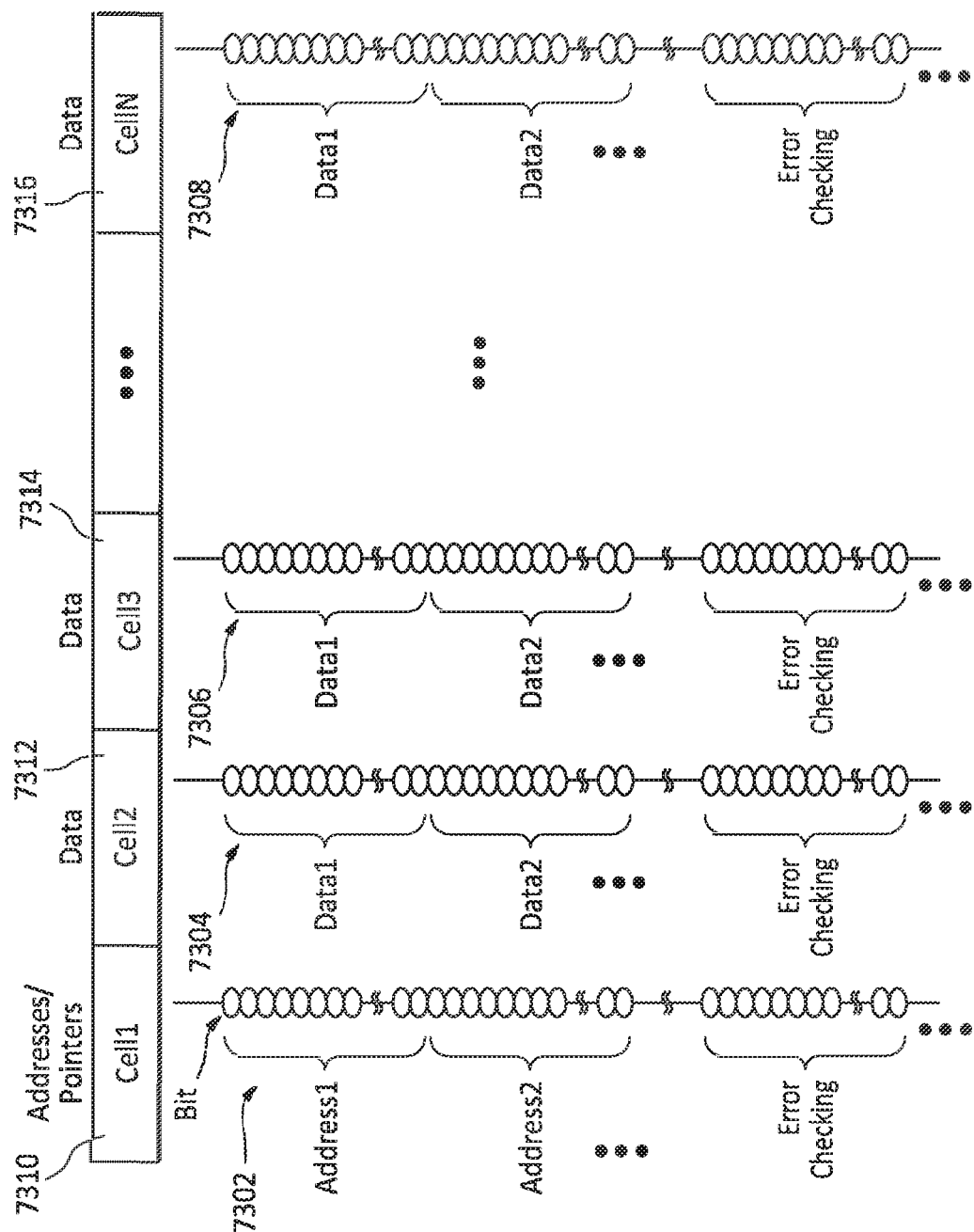
FIG. 9 shows an alternative data format listing of the bits on a memory string for each cell in a row, in accordance with embodiments of the present disclosure.

Referring to FIG. 9, in some embodiments, some cells may store only address information, and some cells only data information. In that case, each row may have a cell, e.g., Cell 1, 7310, which has a memory string 7302 of addresses or pointers, and the remainder of the rows, e.g., Cell2-CellN, 7310-7316, respectively, have corresponding strings of data 7304-7308, respectively. In that case, the addresses or pointers would have a value indicative of where the data is stored on the memory chip, such as a row, column and entry number, e.g. Row 3, Column 8, Entry 50, meaning the data corresponding to this address resides at the 50$^{th}$ data block on the memory string, located in Row 3 and Column 8. This effectively decouples the address from being located physically next to the data, which can provide flexibility in storage. Also, each of the strings may have one or more error checking or security components to validate the information stored on the string. This may be repeated for each row in the array.

Figure 10:
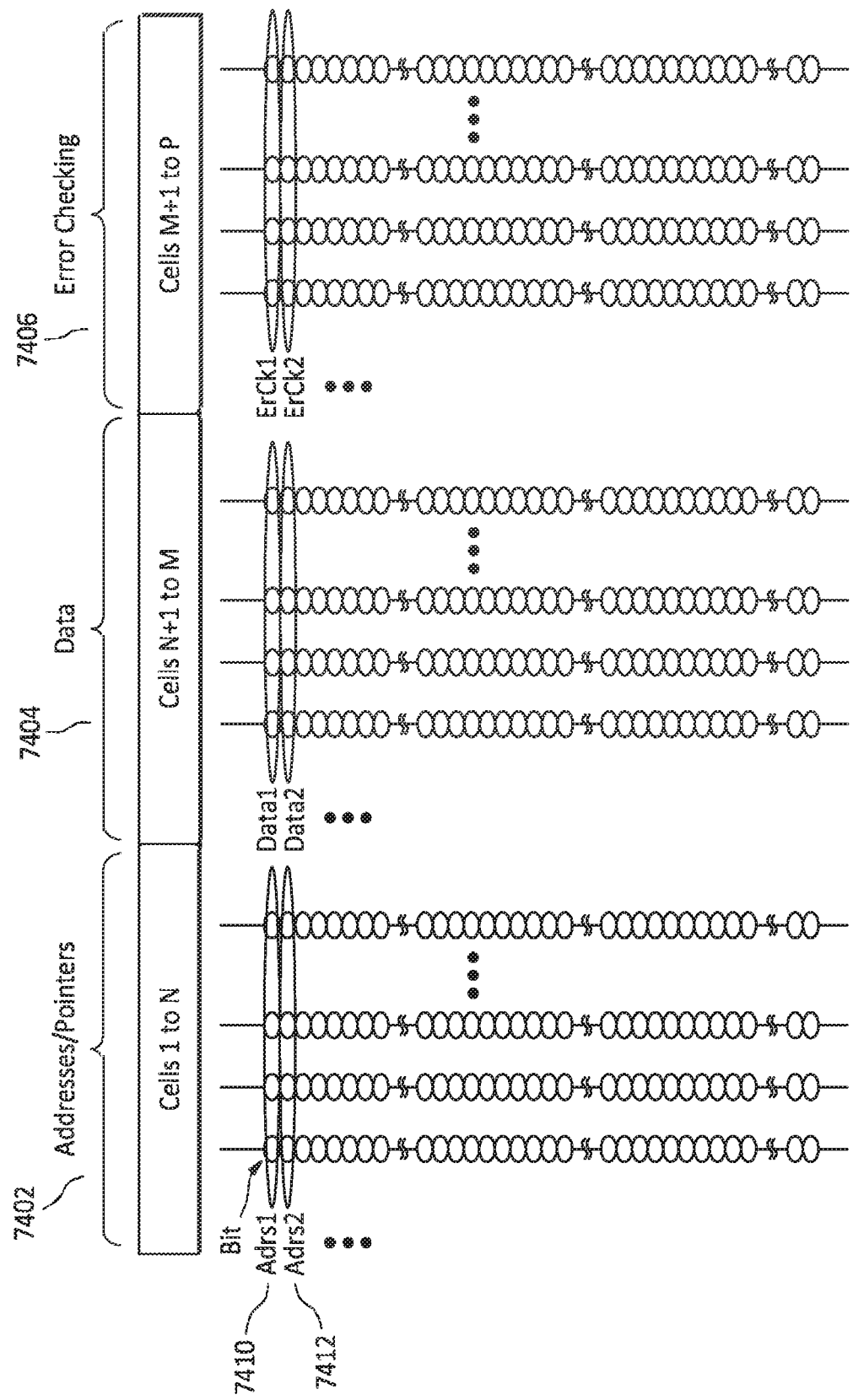
FIG. 10 shows an alternative parallel data storage format listing of the bits on a memory string for memory cells in a row, in accordance with embodiments of the present disclosure.

Referring to FIG. 10, instead of storing information contiguously (or serially) on a given memory string, the data may be stored in the memory cell array in parallel (e.g., across a plurality of memory strings). For example, when a storage word is stored, it may be able to be stored more quickly in a single storage action, storing it across the array, similar to the way traditional semiconductor memory works, but allowing it to do it over and over again due to the 3D depth, each time "pushing" (storing) another storage word in parallel onto a predetermined group of memory strings. Such a format also enables quick parallel retrieval of a given storage word (once located). In that case, certain cells 7402 may be allocated to storing addresses/pointers in parallel, certain cells 7204 may be allocated to storing data in parallel, and certain cells 7406 may be allocated to storing error checking and security data in parallel. For example, the storage word ("Address, Data, Error Checking") stored on memory string 7210 shown in FIG. 8 (which is stored in series on the one string 7210), may be stored as shown as storage word 7410, having Address1, Data1, and Error Check1, and which is stored in parallel across a plurality of cells (1-N, N+1 to M, and M+1 to P). Similarly, for storage word 7412 which would be stacked across the same strings in parallel with the storage word 7410 (either underneath or on top of, depending on the direction of storage on the string). In some embodiments, the data may be stored in parallel in 2 Dimensions (e.g., across a 2D array or matrix of rows and columns at a given layer or depth level), thereby creating a layered 2D array of stored information, such as a multi-layered 2D image capture data may be stored, except allowing a 2D image it to be stored simultaneously at one time, in realtime, with each 2D snapshot stored in the cell array in a single layer on top of the prior snap shot image in the array.

As also discussed in the aforementioned patent applications, while DNA using two and four bits (or bases) representing data to be read have been described herein, any number of "bits" (or monomers or bases) may be used if desired for the data storage polymer (or memory string), provided the change in cell capacitance or impedance (and corresponding resonance frequency, or frequency response) is sufficient to produce an output magnitude and/or phase for each bit that is distinguishable over each of the other bits. While such capacitance (or impedance) change may be accomplished by changing the physical molecular size of the bases (e.g., the diameter), any property of the bases that creates a unique capacitance (or impedance) value of the cell when passing through the nanopore may be used if desired. For example, bases that have different dielectric properties, different ionic (or charge) properties, and/or different quantum mechanical/electrical properties, may be used, provided they meet the desired functional and performance requirements.

As also discussed in the aforementioned patent applications, the bits may be binary bits; however, they are not limited to any base numbering system as the present disclosure allows the memory (or polymer) string (or strand or stick) to write (or add) more than two different values, as described herein. In that case, the cell design would be adjusted accordingly. For example, for a base-4 system (e.g., GCAT, for DNA based system), there would be 4 add chambers and a single de-block chamber, as described herein. This can be extended for any base number system greater than 2, such as 3, 4, 5, 6, 7, 8, 9, 10 (decimal), or more, up to N. Where there would be N add chambers and 1 deblock chamber. The only limitation would be that the chambers are oriented such that the memory string (or DNA or polymer) can reach all the add chambers, as discussed more herein with FIGS. 11, 11A, 11B, 11C, 11D, 11E, 11F, and 12.

As also discussed in the aforementioned patent applications, FIG. 26 in the aforementioned patent applications also depicts a top view showing four addition chambers which share a common reserve or deblock chamber and the polymer is tethered at a position (9) with access to each of the four chambers. The cross section (side view) of this layout would be as depicted in FIGS. 24 and 25 in the aforementioned patent applications, and the charged polymer can be moved into each of the four addition chambers by operation of the electrodes in the electrical control layer (1 in FIG. 24 in the aforementioned patent applications).

Figure 11:
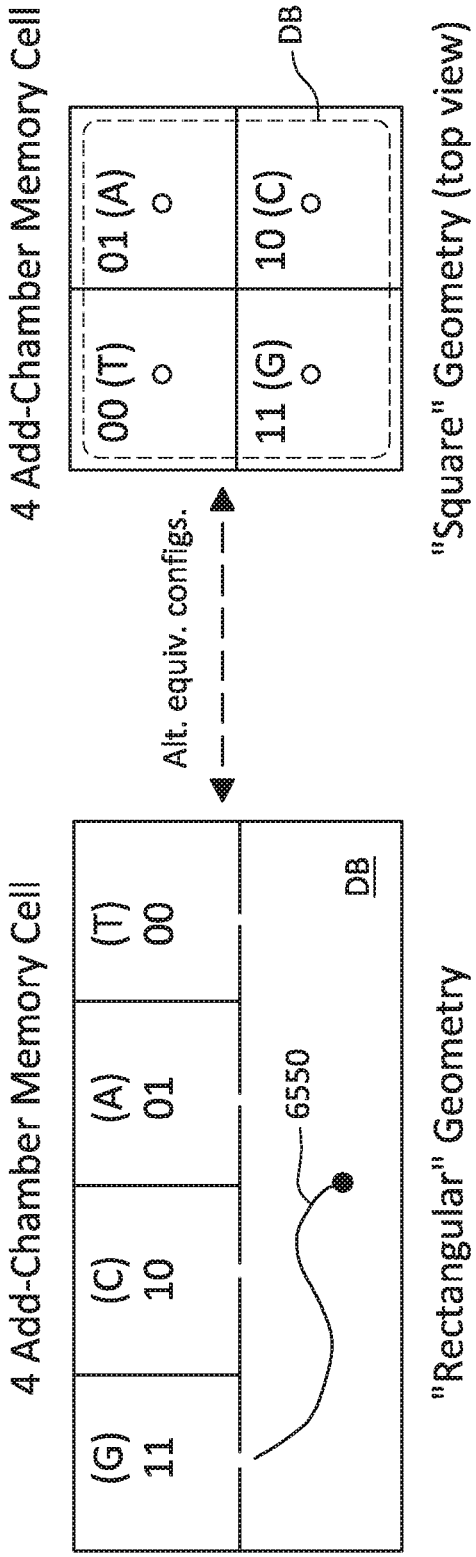
FIG. 11 shows a 4 add-chamber memory cell and an alternative square geometry top view, and corresponding two-bit binary codes or DNA bases codes, in accordance with embodiments of the present disclosure.

More specifically, referring to FIG. 11 herein, two 4 add-chamber memory cells are shown, a side view of a row of chambers, and a top view of a square geometry configuration of chambers. In both configurations. the memory string 6550 resides in a deblock (DB) chamber and can enter the four addition or "add" chambers. Each of the four add chambers has a unique chemical construct (or monomer) or code that is added to the polymer memory string 6550. This can be viewed as four (4) unique codes, which in binary would be 00, 01, 10, 11 (or 0 to 3 in decimal). The four codes could also be the four bases in DNA, i.e., GCAT, as discussed herein and in the aforementioned patent applications. Such a configuration enables the bulk writing of information or data (multiple bit writing) with a single chamber add reaction, which increases the storage density of data and speed at which the data can be stored, over writing a single bit during each write cycle (or add reaction). This can be done for any number of unique addition chambers that provide a unique code (or chemical item or construct) in a given memory cell, the only limit is the number of unique chemical items or constructs that can be added or written to the memory string (or polymer), and that can be identified (or read), as described more herein.

In particular, FIG. 11 shows 4 Add-Chambers in Memory Cell; 2-bit binary writing (00 to 11) OR Any set of 4 different (unique) codes or chemical items (e.g., G,C,A,T (DNA bases), or flowers, stars, dumbbells, etc.). Some other features include: DNA (or other polymer "memory string") attached to a bead or origami or to bottom (or a wall) of de-block (DB) chamber (if long enough); enables bulk writing of information/data, e.g., codes or multiple bit writing, with a single add-chamber reaction; can be done for any number of unique add chambers in a given memory cell; and limited only by the number of unique chemical items or constructs (or monomers) that can be added or written to the memory string and that can be identified (read).

Referring to FIG. 11A, an 8 add-chamber memory cell is shown, as a side view of a row of 8 add chambers corresponding to 8 unique chemical constructs (or monomers) that are individually added to the polymer memory string during an add reaction. This can be viewed as eight (8) unique codes, which, in binary, would be 000 to 111 (or 0 to 7 in decimal).

Figure 11B:
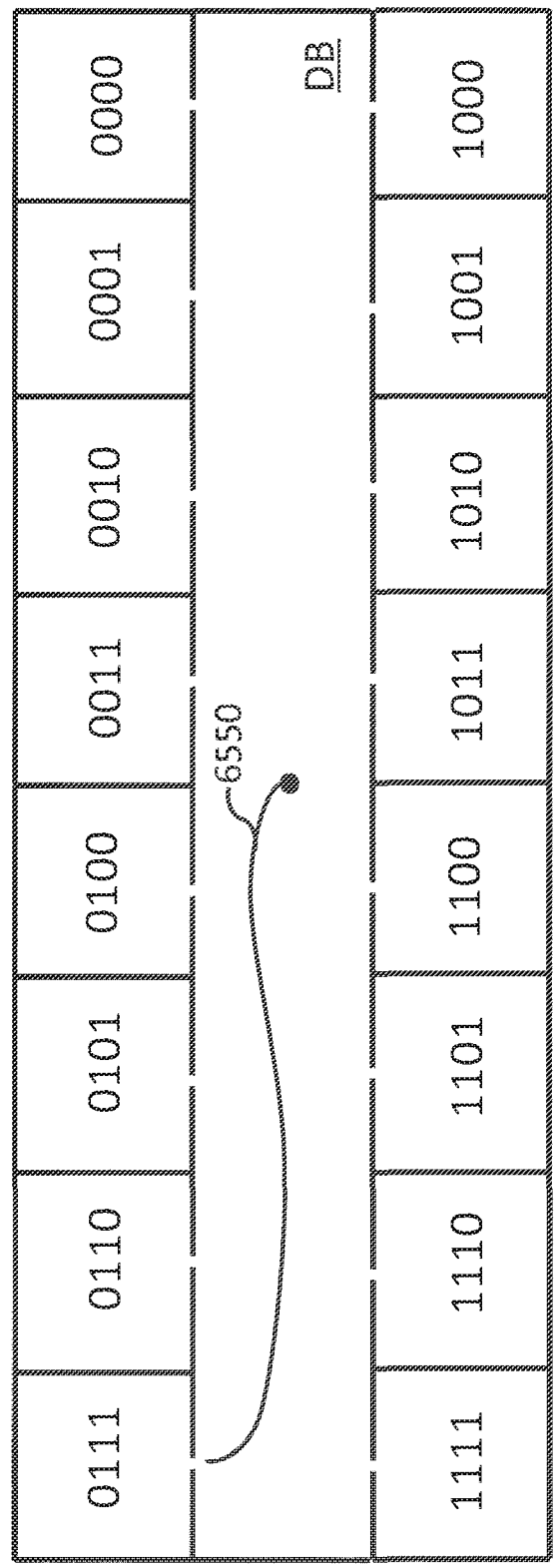
FIG. 11B shows a 16 add-chamber memory cell and corresponding four-bit binary codes, in accordance with embodiments of the present disclosure.

Referring to FIG. 11B, a 16 add-chamber memory cell is shown, configured as 2 rows of 8 add chambers (or a 2×8 array or matrix) corresponding to 16 unique chemical constructs (or monomers) that are individually added to the polymer memory string during an add reaction. Also, this may be configured as a side view or a top view. This can be viewed as sixteen (16) unique codes, which, in binary, would be 0000 to 1111 (or 0 to 15 in Decimal, or 0 to F in Hexi-decimal). The configuration shown has having 2 rows facing each other on opposite sides of the deblock chamber (DB); however, any other geometry may be used if desired, provided the polymer string 6550 can access the add chambers. For example, the rows may be arranged next to each other, and disposed above a common deblock chamber DB, similar to that shown in FIG. 3 hereof, except having 8 add-chambers in each row.

Referring to FIG. 11C, having multiple bit configurations allows for bit number reconfiguration if one or more add chambers fails (or becomes non-operational). In particular, FIG. 11C shows an example of a single chamber failure, which, when detected, the memory controller 6802 (FIGS. 4, 6), and corresponding logic associated therewith, may reconfigure the bit configuration for the current number of available operational add chambers. In this case, there would now be 15 unique codes instead of 16, and the logic can automatically reconfigure how the data is represented by this new set of unique codes. Such reconfiguration may be done upon initialization of the chip after production testing (before first use) or done automatically in real-time while the chip is in use.

Referring to FIG. 11D, in some embodiments, the logic may automatically reconfigure the data from a 4-bit binary code writing to 3-bit binary code writing, by using only 8 of the 15 remaining working chambers. If one or multiple chambers fail (or become non-operational or inoperable or non-functional), the logic can automatically switch to any of the 8 add chambers that are operational (or functional). Once reconfigured to a 3-bit binary code, the logic can tolerate up to a total 8 chamber failures without having to change the number of bits written. Other reconfiguration approaches may be used if desired to accommodate a failed (or non-operational) add chamber. Such reconfiguration may be done upon initialization of the chip after production testing (before first use) or done automatically in real-time while the chip is in use.

Figure 11E:
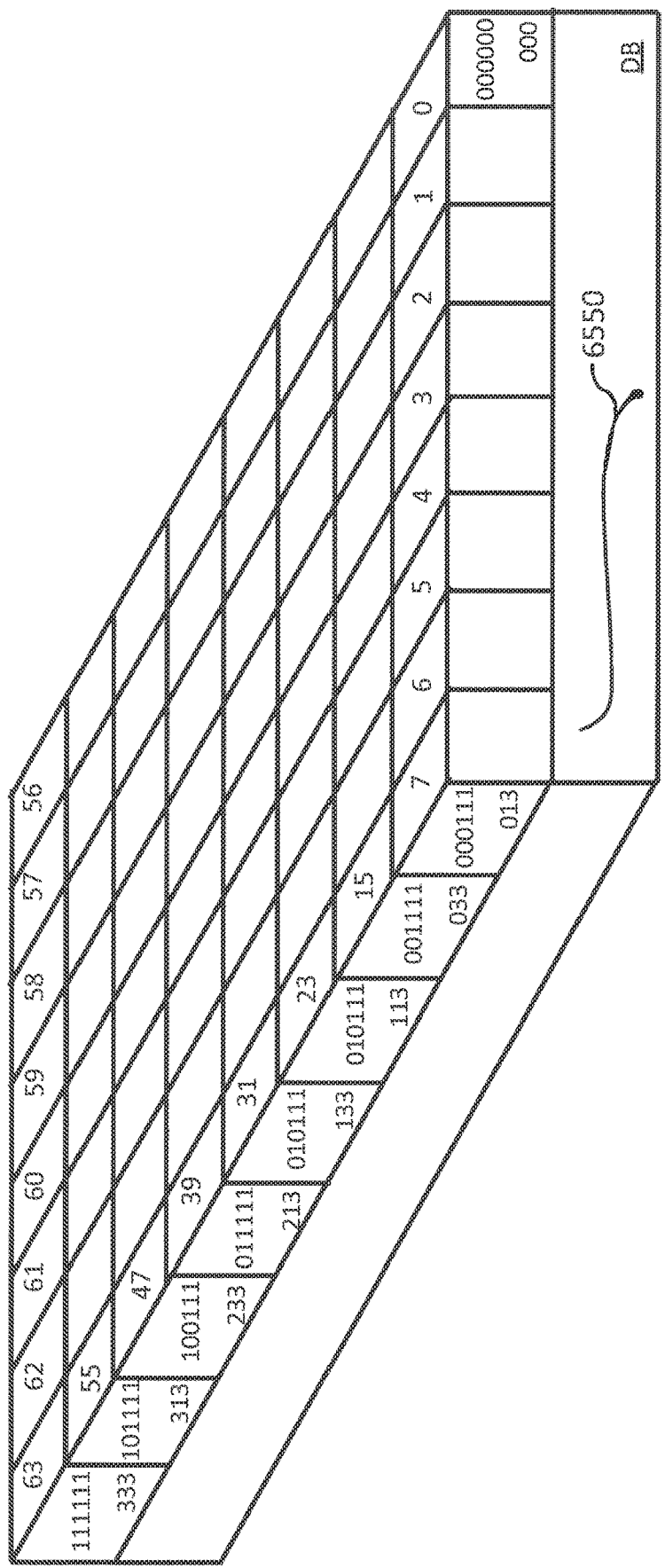
FIG. 11E shows a 64 add-chamber memory cell array (or matrix) and corresponding six-bit binary codes and 3-bit Base-4 codes, in accordance with embodiments of the present disclosure.

Referring to FIG. 11E, a 64 add-chamber memory cell is shown, as a view of a row of 64 add chambers corresponding to 64 unique chemical constructs (or monomers) that are individually added to the polymer memory string during an add reaction. This can be viewed as sixty-four (64) unique codes, which, in binary, would be 000000 to 111111 (or 0 to 15 in decimal). The configuration is shown as an 8×8 array (or matrix) above a common deblock chamber (DB); however, any other geometry or matrix sizes may be used if desired, provided the polymer string can access the add chambers. Also, the automatic reconfiguration described herein above may be used with any of the configurations or embodiments described herein provided there are sufficient remaining operational chambers to permit it.

Referring to FIG. 11F, a top view of an 8 add-chamber memory cell having a circular geometry with pie-shaped add chambers having nanopores near the center of the circle to reduce the travel distance for the polymer memory string to reach the add chambers. The deblock chamber (shown as a dashed circle DB) is located below the membrane with nanopores, similar to the other embodiments described herein.

Referring to FIG. 11G, a 64 add-chamber memory cell top view having a circular geometry with add chambers having nanopores located in concentric circles intersecting with radial separation lines/walls making segmented a pie-shaped structure to reduce the travel distance for the polymer memory string to reach the add chambers. The deblock chamber (not shown) is located below the membrane with nanopores, similar to the other embodiments described herein.

Referring to FIG. 12, in some embodiments, using various multi-bit writing configurations, such as those shown and described in the aforementioned patent application (or any other configurations that accomplish the same result), may be used to create an array or plurality of N-chamber memory cells to provide further enhanced data storage density. In particular, M memory cells having N add chambers per cell, allows for the creation of a Base-N storage "word" having M digits, written in parallel across memory strings for each of the cells, where the "word" would have values of 0 to $(N^M)-1$. Also, a single memory cell or string creates a Base-N "word" having M digits or codes along the length of the memory string (word values of 0 to $(N^M)-1$), written in a single memory cell or string.

Also, in that case, the cells (Cell1-CellM) may, in some embodiments, all be identical, each cell having the same N unique codes. FIG. 12 shows examples for several different values of N (number of unique add chambers per cell). In particular, for N=4, each cell would have four unique values or states capable of being stored in each corresponding memory string (each cell being similar to that shown in FIG. 11). Similarly, for N=8, each cell would have eight unique values or states capable of being stored in each corresponding memory string. Similarly, for N=10, each cell would have ten unique values or states (or decimal) capable of being stored in each corresponding memory string. Similarly, for N=16, each cell would have sixteen unique values or states (or hexadecimal) capable of being stored in each corresponding memory string. Also, each of the bit writing configurations and approaches discussed herein with FIGS. 7-10, may be done using multi-bit memory cells (more than 2 add chambers) instead of single "bit" cells. In that case, each "bit" oval 7104 (FIG. 7) along the memory string 7102, may represent a plurality of bits or unique code, corresponding to the number of add chambers having unique chemical constructs in the memory cell being used. As a result, high density data storage is achieved using such the multi-bit writing approach of the present disclosure.

Also, FIG. 12 shows: M memory cells with N add chambers per cell (and one De-Block chamber (DB) per cell); the N add chambers correspond to N different (or unique) adding states or chemical constructs; each cell (or corresponding memory string) can be used to create a Base-N "digit" (or bit or byte); group of M cells creates a Base-N "word" having M digits (word values of 0 to (N^M)−1), written in parallel across multiple memory cells or strings. Also, a single memory cell or string creates a Base-N "word" having M digits or codes along the length of the memory string (word values of 0 to (N^M)−1), written in a single memory cell or string.

In some aspects or embodiments, the invention provides a method for storing data on a polymer in a nanopore-based device, comprising providing a memory cell having at least three chambers, including at least two add chambers and a "deblock"/"de-protect" chamber, each of the add chambers having a nanopore arranged to allow the polymer to enter and exit the add chamber and each of the add chambers arranged to add a unique code to the polymer when the polymer enters the respective add chamber, and the "deblock" chamber arranged to enable the polymer to receive the code when the polymer enters the respective add chamber; and successively steering the polymer from the "deblock" chamber through the nanopore to the add chambers to add the codes to the polymer based on a predetermined digital data pattern to create the digital data pattern on the polymer.

In some aspects or embodiments, the invention provides a method for storing data using a polymer, comprising: providing a nanopore polymer memory device, the device having at least one memory cell comprising at least two addition chambers, each of the addition chambers arranged to add a unique code to the polymer when the polymer enters the respective addition chamber, the data comprising a series of the codes having a number of data states corresponding to the number of unique codes; and successively steering the polymer through the nanopore into the addition chambers to add the codes to the polymer based on a predetermined digital data pattern to create the digital data pattern on the polymer.

In some embodiments, the number of unique codes for each memory cell may be any integer greater than 2. In some embodiments, the number of unique codes for each memory cell may a binary number. In some embodiments, the number of unique codes for each memory cell may be a binary number greater than 2, such as: 4, 8, 16, 32, 64, 128, 256, 512, 1024, 2048, 4096, 8192, 16384, 32768, or 65536, or higher. In some embodiments, each code may be indicative of a digit in a word, the digit having a Base-N based on the number of unique codes, and the word having a length M based on the number of digits. In some embodiments, the code is indicative of a multi-bit binary digital code.

Also, in some embodiments, each code may be indicative of a digit in a word, the digit having a Base-N based on the number of unique codes, and the word having a length M based on the number of digits. In some embodiments, the nanopore memory device of the present disclosure may include one or more memory cells in the device. Also, any technique for reading the unique codes written to the memory string (or polymer) may be used if desired.

In the case where more than two add chambers are used for a memory cell, the cells shown in FIG. 1 would be replaced with cells having more than two add chambers. In that case, the corresponding input and output voltage control lines would change as appropriate to accommodate the additional add chambers. In that case, the number of resonators or resonant frequencies may increase as appropriate, depending on the resonator design configuration used, as would be understood by those skilled in the art. A corresponding change may be made, as appropriate, to any of the embodiments discussed herein (or in the aforementioned patent applications) when increasing the number of add chambers above two, as would be understood by those skilled in the art.

The term "data" as used herein includes all forms of data including data representing addresses (or labels or pointers, including physical or virtual), machine code of any type (including but not limited to object code, executable code and the like), error checking, encryption, libraries, databases, stacks, and the like that may be stored in memory. In certain examples, such as in FIGS. 7-10 (or elsewhere as the context implies), the term "Data" may be shown or described as being separate from the "Address," or "Error Checking". In those cases, these terms may be used to show different forms of data for illustrative purposes only.

As discussed hereinbefore, when the DNA (or polymer) memory string is passing through the nanopore, the DNA translocation rate (or transfer rate, or velocity) may vary based on numerous factors, including, but not limited to, the applied electric field, the angle of the DNA string approaching the nanopore, the geometry of the nanopore (cone, cylinder, etc.), the diameter of the nanopore compared to the diameter of the string (which may vary along its length), the amount of tangling or wrapping or coils in the string, how the velocity varies along the length of the string, fluid dynamic effects, friction/attraction/binding with walls of chamber, viscosity effects, acoustic waves in the fluid, and other factors. Accordingly, it would be desirable to have a consistent predetermined translocation rate, which corresponds to data bit rate, to provide the ability to read the data stored in the DNA (or polymer) memory string accurately, repeatably and reliably.

As also discussed herein, the DC steering voltage Vst (or Vin) may be applied to the top and bottom electrodes to move or steer the DNA from one fluid-filled chamber to another through the nanopores. As also discussed, the DNA translocation time (or rate or speed or velocity) of the DNA through the nanopore may be adjusted or stopped at any time by adjusting the magnitude and polarity of the DC component of the Vst, while not affecting the AC measurement or sensitivity.

Figure 13:
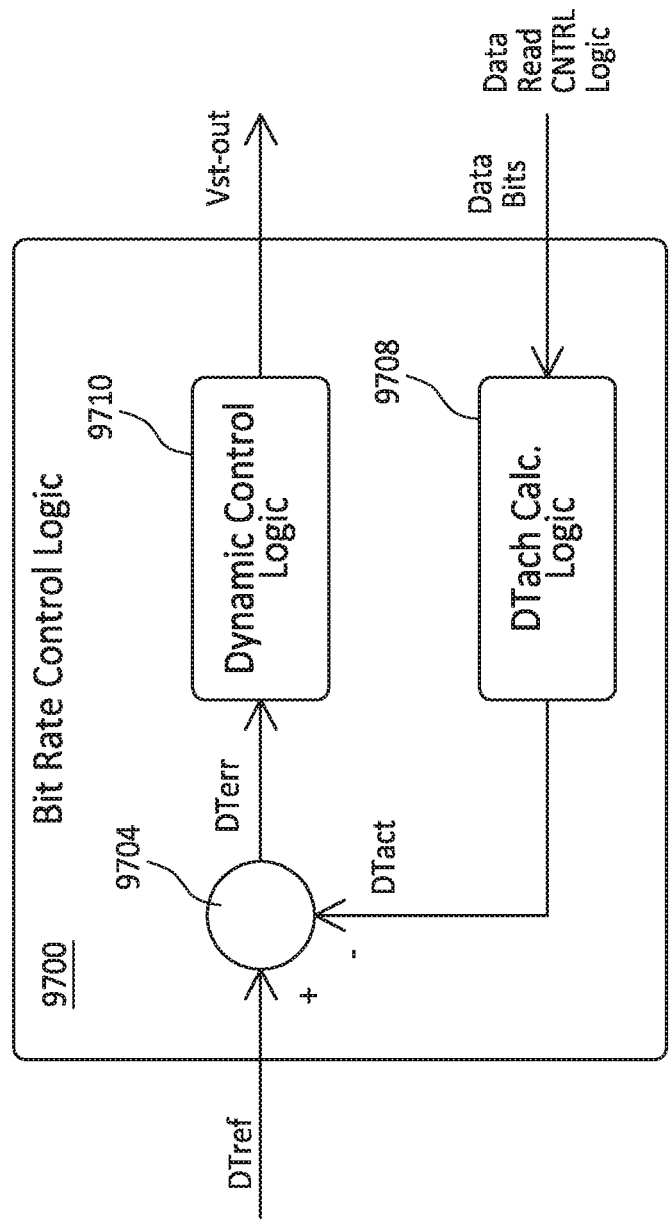
FIG. 13 is a block diagram of Bit Rate Control Logic, in accordance with embodiments of the present disclosure.

Referring to FIG. 13, a Bit Rate Control (BRC) Logic 9700 may be used to provide a closed-loop feedback control system or servo controller to adjust or drive the DNA steering voltage Vst (and thus the translocation rate of the DNA) to obtain a desired consistent data bit rate, in accordance with embodiments of the present disclosure. In some embodiments, the BRC Logic 9700 may be part of the Read/Write Memory Controller 6802 (FIG. 4) and/or may be part of the Write/Vst Control Logic 6804.

In particular, a predetermined desired (or reference or set-point) minimum mean time between data bits DTref (or mean bit gap time, or mean bit gap, or mean bit spacing, or mean bit rate), e.g., 1 microsecond/bit, is provided to the BRC Logic 9700. The DTref data value may be a default parameter stored in the memory of the controller 6802 (FIG. 4) or received or retrieved from another source, e.g., a remote server or a command from another controller or computer, and may be a static value or may change over time. Other values for the DTref may be used if desired.

The BRC Logic 9700 also receives Data Bits read in real-time which are indicative of the data stored in the DNA (or polymer) memory string passing through the nanopore, which may be provided from the Read Control Logic 6850 (FIG. 4) on the line 6860. The real-time data bits are provided to DT Calculation Logic 9708 which determines the actual real-time average (or mean) time DTact between the Data Bits received from the Read CNTRL Logic. The written bits may be coded (or encoded) such that there are is a minimum and maximum number of sequential 1's, or the known "Run Length Limited" (or RLL) coding, e.g., RLL 2,7, meaning the minimum number of sequential 1's is 2 and the maximum is 7. Other bit coding approaches and values may be used if desired.

The values of DTref and DTact are provided to a comparator 9704 (or summer or summing junction), which calculates the difference between the two data signals (DTref-DTact) and provides a bit gap error (or bit rate error or difference) signal DTerr, indicative of the error (or difference) between the reference bit gap time DTref and the actual bit gap time DTact. The bit gap error DTerr is then provided to Dynamic Control Logic 9710, e.g., a proportional-integral (or P-I) controller (K/S), where 1/S represents an integrator in the Laplace transform or frequency space, which provides a digital signal Vst-out, indicative of the DNA steering voltage signal Vst needed to change the speed of the DNA to drive the mean bit gap error signal DTerr to (or toward) zero. The steering voltage will continue to increment up or down until the error signal DTerr is zero, meaning the desired mean gap time (or bit rate) has been met, at which point it will hold the steering voltage at that level until the error DTerr becomes non-zero (i.e., the DNA translocation velocity changes), thereby providing a real-time closed-loop servo control.

The output signal Vst-out may be provided to the processor 8610 (FIG. 4) to determine the voltages to be applied to the appropriate Add "0", Add "1", and "Deblock" (or "Deprotect") lines, as described herein, corresponding to respectively named fluidic chambers, to provide the desired DNA (or polymer) velocity through the nanopore, or to provide the function and performance described herein. In some embodiments, Vst-out may also be an incremental steering voltage signal that gets added to (or subtracted from) the current Vst steering voltages to adjust the DC steering voltage in a given direction.

Any other type of control transfer function(s) may be used for Dynamic Control Logic 9710 if desired, such as a proportional, proportional-integral-derivative (P-I-D), low pass (LP), high pass (HP), bandpass (BP), quadratic ($2^{nd}$ order), linear, non-linear, lead/lag, multi-order, or any other form of control logic that provides the desired function and performance. Also, in some embodiments, to provide the desired overall dynamic control system performance and stability response, portions of the Dynamic Control Logic may be placed in the feedback portion of the loop, i.e., in the path of the DTact Calc. Logic 9708 (the "−" side of comparator 9704), and/or in the reference path, i.e., before the comparator 9704 where DTref enters the comparator (the "+" side of comparator 9704). Also, Dynamic Control Logic 9710 and/or the DTact Calc. Logic 9708 may be implemented digitally in software, hardware or firmware and/or may be implemented (partially or completely) using analog components.

Also, the BRC Logic 9700 may be used with any type of write/read memory controller capable of controlling the velocity of the DNA (or polymer) memory string through a nanopore (or nanochannel) and capable of reading data the corresponding bits from the memory string in real-time. Also, any type of reading technology may be used, such as longitudinal (along nanopore length) or transverse (across nanopore diameter), AC-based or DC-based, ionic current-based, impedance based, capacitance-based, or any other technique for reading the memory string bits.

The parameters and coefficients for the Dynamic Control Logic 9710 and/or the DTact Calc. Logic 9708 may be optimized in real-time and/or learned over time using known control optimization logic and/or machine learning techniques and classifiers, such as support vector machines (SVMs), neural networks, decision tree classifiers, logistic regression, random forest, or any other machine learning or classification techniques that perform the functions of the present disclosure. Similarly, the value for DTref may also be optimized or learned over time using similar machine learning techniques that may be executed as part of the Bit Rate Control Logic and/or the Read/Write Memory Controller 6802 (FIG. 4).

Also, the mean bit rate reference values or set points (or target bit rate or DTref) may vary over time and conditions, based on various factors. For example, the bit rate reference may be a first rate ("write" bit rate) when the system is writing data onto the polymer and a second rate ("read" bit rate) when the system is reading the data/codes stored on the polymer. Also, the desired bit rate reference may vary (linearly or non-linearly) based on various system factors such as what data is written on the memory string or polymer or DNA, or based on where along the string the data is located relative to the nanopore, or based on the force dynamics on the nanopore which may vary based on various factors as discussed herein. Also, when the device comprises a plurality of memory cells or a memory array, such as that shown in FIGS. 15 and 16, the servo controller may simultaneously control the bit rate for each of the memory cells, arrays, chips or devices, independently, or in groups or collections of cells, arrays, chips or devices, depending on the desired performance and cell characteristics.

Also, the necessary fluids for writing to and/or reading from the nanopore memory chip 6700 (FIG. 1) or nanopore polymer memory (NPM) chip, may be pre-loaded into the chip upon manufacture and remain in the chip, without the need for fluids or reagents to be added or removed from the chip 6700. Thus, while the chip may have fluids residing inside the chip, the chip may be a self-contained "dry-use"

memory storage and/or retrieval chip or device. In that case, the instrument 7502 (FIG. 1) for providing or receiving fluidics and/or reagents to or from the chip 6700 may not be needed. Also, the read/write memory controller 6802 (FIG. 4) may be part of the nanopore memory chip 6700. In addition, on or more of the nanopore polymer memory (NPM) chips 6700 and the read/write controller 6802 (FIG. 4) may be integrated into the computer system 6870 or a memory server computer or other computer system or device that can be connected to a network (wired or wireless) for communication (writing and/or reading of data), any of which may be referred to herein as a Nanopore Polymer Memory (NPM) System or Server 7500 (FIG. 1), discussed more hereinafter.

Also, the memory chip 6700 or NPM Server 7500 may be used as a data write and/or read device or system. In some embodiments, it may be used for long term storage (or archival or back-up or "cold storage") of data, such as a write-once-read-many times (WORM) memory, where data may be stored very efficiently (high data density per chip) on the NPM chip or server 7500 using techniques and/or devices of the present disclosure, and then retrieved (or extracted or read) when needed. The memory chip 6700 or server 7500 may also be used as a real-time read/write memory which can be written to and/or read from in real-time or at any time, to/from any memory cell or location, similar to a random access memory (RAM), but (unlike typical RAM), the data stored in the memory cells 6702 would not be lost (or erased) when power is removed from the NPM chip 6700 or server 7500.

Figure 14:
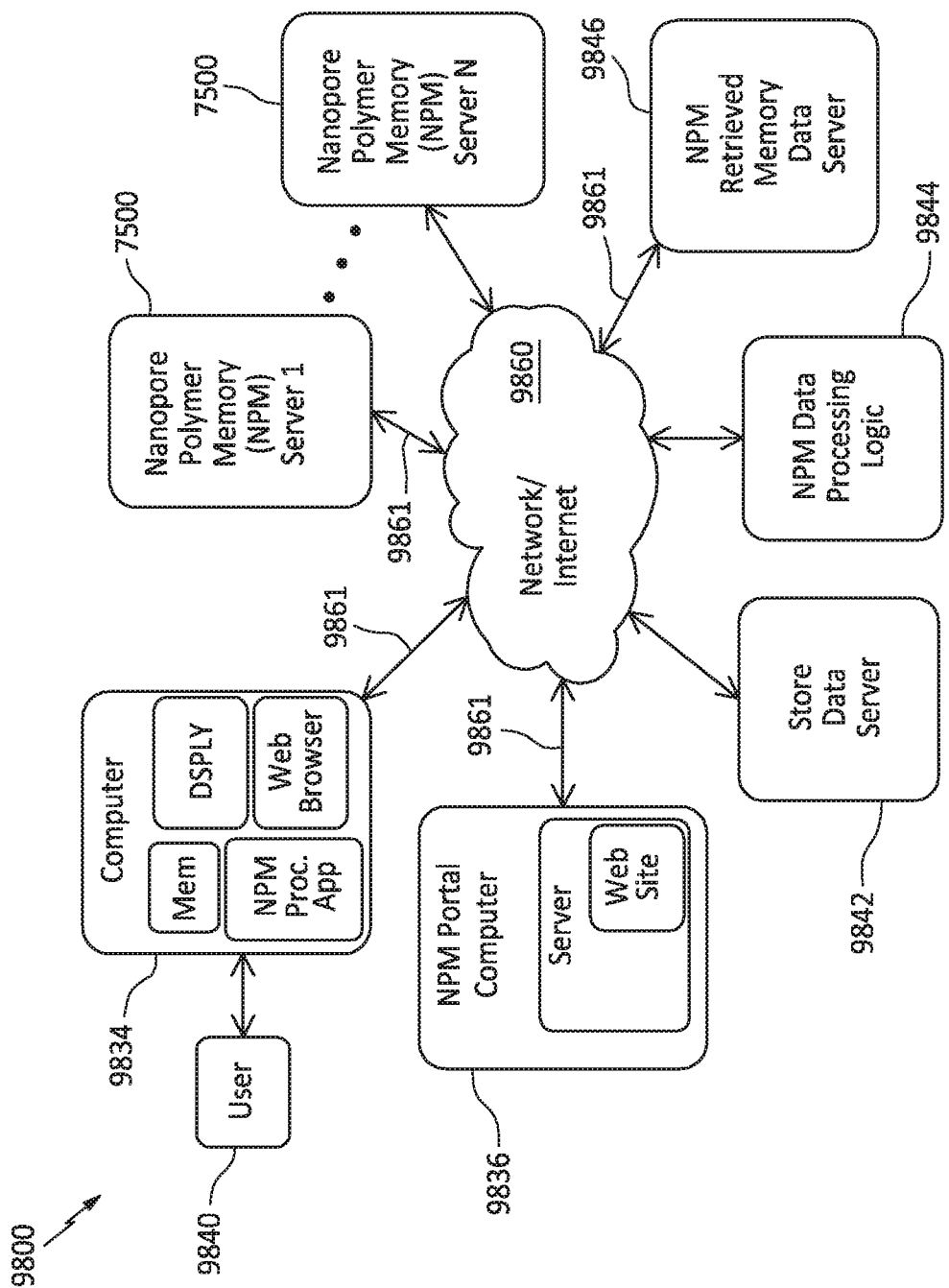
FIG. 14 is a top-level block diagram of components of a nanopore polymer memory system, in accordance with embodiments of the present disclosure.

Referring to FIG. 14, the NPM chip or server 7500 of the present disclosure may be used as a stand-alone device (or system or server), or in a network configuration or environment as part of a data memory storage and/or retrieval system 9800 or nanopore polymer memory (NPM) system. In particular, one or more NPM servers 7500 (which may contain a plurality of NPM chips 6700) may communicate with various devices, computers and/or servers, such as a User Computer 9834, an NPM Portal Computer 9836, Store Data Server 9842, NPM Data Processing Logic Server 9844, NPM Retrieved Data Server 9846, through a communications network 9860, such as a local area network (LAN), wide area network (WAN), virtual private network (VPN), peer-to-peer network, or the internet, or world-wide web, wired or wireless, as indicated by lines 9861, by sending and receiving digital data over the communications network 9860.

The data or logic servers 9842, 9844, 9846 may be any type of computer server with the necessary software or hardware (including storage capability) for performing the functions described herein. Also, the servers 9842, 9844, 9846 (or the functions performed thereby) may be located, individually or collectively, in a separate server on the network 9860, or may be located, in whole or in part, within one (or more) of the NPM Servers 7500 on the network 9860. In addition, the NPM Servers 7500 may each also communicate via the network 9860 with each other or any network-enabled devices or logics necessary to perform the functions described herein. The NPM Servers 7500 may collectively form a network-based (or cloud-based) server "farm" for storing and/or retrieving large amounts of digital data.

In some embodiments, a user 9840 may interact with the user Computer 9834, to store desired user data in the NPM Server(s) 7500. In particular, the user Computer 9834 may be a general-purpose computer having a display (DSPLY), a network or web browser, local memory storage (Mem), and an NPM Processing Software Application (NPM Proc. App) capable of performing the functions described herein, as discussed more herein. In addition to local digital memory storage located in the user computer 9834 itself, the user computer 9834 may also interface with or be connected to separate external storage devices such as flash drives, thumb drives, hard disk drives, CD ROM drives, servers, or any other external storage device or component, connected via USB ports or other ports.

The user computer (or user device) 9834 may any computer-based device capable of performing the functions described herein, such as a laptop, desktop, tablet, mobile device, smartphone, e-reader, or any other computer-based device. In some embodiments, the NPM Server(s) 7500 may communicate directly with the user computer 9834 via the network 9860 to store and/or retrieve user 9840 data. The digital user data may include data of all kinds including, but not limited to, images, text, audio, video, documents, spreadsheets, metadata, address information, and the like, which may be accessed by the user computer/device 9834.

Also, the user computer/device 9834 may also have local digital storage located in the device itself (or connected directly thereto, such as an external USB connected hard drive, thumb drive or the like) for storing data, images, audio/video, documents, and the like, which may be accessed by an NPM Processing App running on the user computer/devices 9834.

In some embodiments, the NPM Server(s) 7500 may communicate with an NPM Portal Computer 9836 via the network 9860 to facilitate the storage and/or retrieval of user data. The NPM Portal 9836 may contain a server (Server) running a website (Web Site) enabling multiple users, such as the user 9840, to log in and to store, retrieve, use and/or review some or all of the user's digital data. The users 9840 may securely log in through preset username and password information to ensure the privacy of their individual data. In some embodiments, the users' stored data may be displayed in multiple formats on the website which may be accessed via the user computer/device 9834.

In some embodiments, the user 9840 may log into the NPM Portal web site via the user's Web Browser on the user computer 9834, and have the user computer 9834 request that certain user data, which may be currently in local memory (Mem) on the user computer 9834, be stored (or saved) in the NPM Server(s) 7500, e.g., for back-up storage or for other purposes. In that case, the requested user data may be uploaded to the NPM Server on the NPM Portal Computer 9836 via the NPM Portal web site, or may be uploaded to the Store Data Server 9842, as a temporary holding place for the data to be stored in the NPM Server(s) 7500. Once the data to be stored has been uploaded to the NPM Server or Store Data Server 9842, the NPM Portal Computer 9836 may communicate with the NPM Server(s) 7500 to store (or initiate storage of) the desired user data in the NPM Server(s) 7500, as described in the present disclosure. The NPM Portal 9836 may provide the NPM Server(s) 7500 the server location/address and folder name of where the data is temporarily stored (e.g., the Store Data Server) and the NPM Server(s) 7500 may then begin the storage process. In some embodiments, the Store Data Server 9842 may be a remote storage server or memory device that is used by the user to save data. In that case, the user would provide the server location/address and folder name of the user's Store Data Server 9842.

Depending on the amount of data to be stored, the time to store all the desired data in the NPM Server(s) 7500 may not be instantaneous. Once the data has been successfully stored in the NPM Server(s) 7500, the user may receive an alert or message (e.g., text or email message) indicating that the data has been stored. The user may also receive an electronic bill or invoice for the data storage service or may pay a monthly, quarterly or annual subscription fee or an on-demand use fee (based on usage), for use of the NPM Portal 9836 and/or the NPM Server(s) 7500. The user may also set various user-selectable attributes for what data should be retrieved, through the portal or website or otherwise.

At a later time, after storage is complete, when the user 9840 desires to retrieve (or read) the data stored in the NPM Server(s) 7500, the user 9840 may log into the NPM Portal and request that the data be retrieved from the NPM Server(s) 7500. In that case, the NPM Portal 9836 may communicate with the NPM Server(s) 7500 to request that the data be retrieved from the NPM Server(s) 7500. The stored data may be read or retrieved or extracted from the NPM Server(s) 7500 in any way that provides the desired data to the user. In some embodiments, the NPM Processing Logic 9844 may be used to retrieve the "raw" stored digital data in the NPM Server(s) 7500 and process the raw digital data, e.g., perform error correction, remove coded data or special bits placed in data during writing, perform decoding, decryption, decompression and any other data processing needed to be performed on the raw stored data to enable the retrieved data to be accessed, read, stored, and/or used by the user 9840 or the user device/computer 9834. The raw stored data and the processed or "clean" data may be stored in the NPM Retrieved Data Server 9846 for access by the NPM Portal or directly by the user device/computer 9834. In some embodiments, the NPM Data Processing Logic 9844 may be performed on the NPM Portal Computer 9836 or on the user computer 9834 using the NPM Proc. App., which would perform some or all of the functions of the NPM Processing Logic 9844. In that case, the raw and/or clean data may be stored on the NPM Portal 9836 server, user computer 9834 memory (on board or external), the NPM Retrieved Data Server 9846, or any other server or storage device, as desired.

In the case where the user computer/device 9834 communicates directly with the NPM Server(s) 7500 via the network 9860 to store and/or retrieve user data (without the use of the NPM Portal 9836), the computer 9834 may also communicate with the devices, logic and/or servers discussed herein, e.g., 9842, 9844, 9846, as needed or desired to perform the functions described herein without the use of the NPM Portal 9836.

Portions of the present disclosure shown herein as being implemented outside the NPM Servers 7500, may be implemented within the NPM Servers 7500 by adding software or logic to the NPM Servers 7500, such as installing a new/additional application software, firmware or hardware to perform some of the functions described herein, such as some or all of the NPM Data Processing Logic 9844, or other functions, logics, or processes described herein. Similarly, some or all of the NPM Data Processing Logic 9844 of the present disclosure may be implemented by software in one or more of the other servers on the network, such as servers 9842, 9846, to perform the functions described herein.

Figure 15:
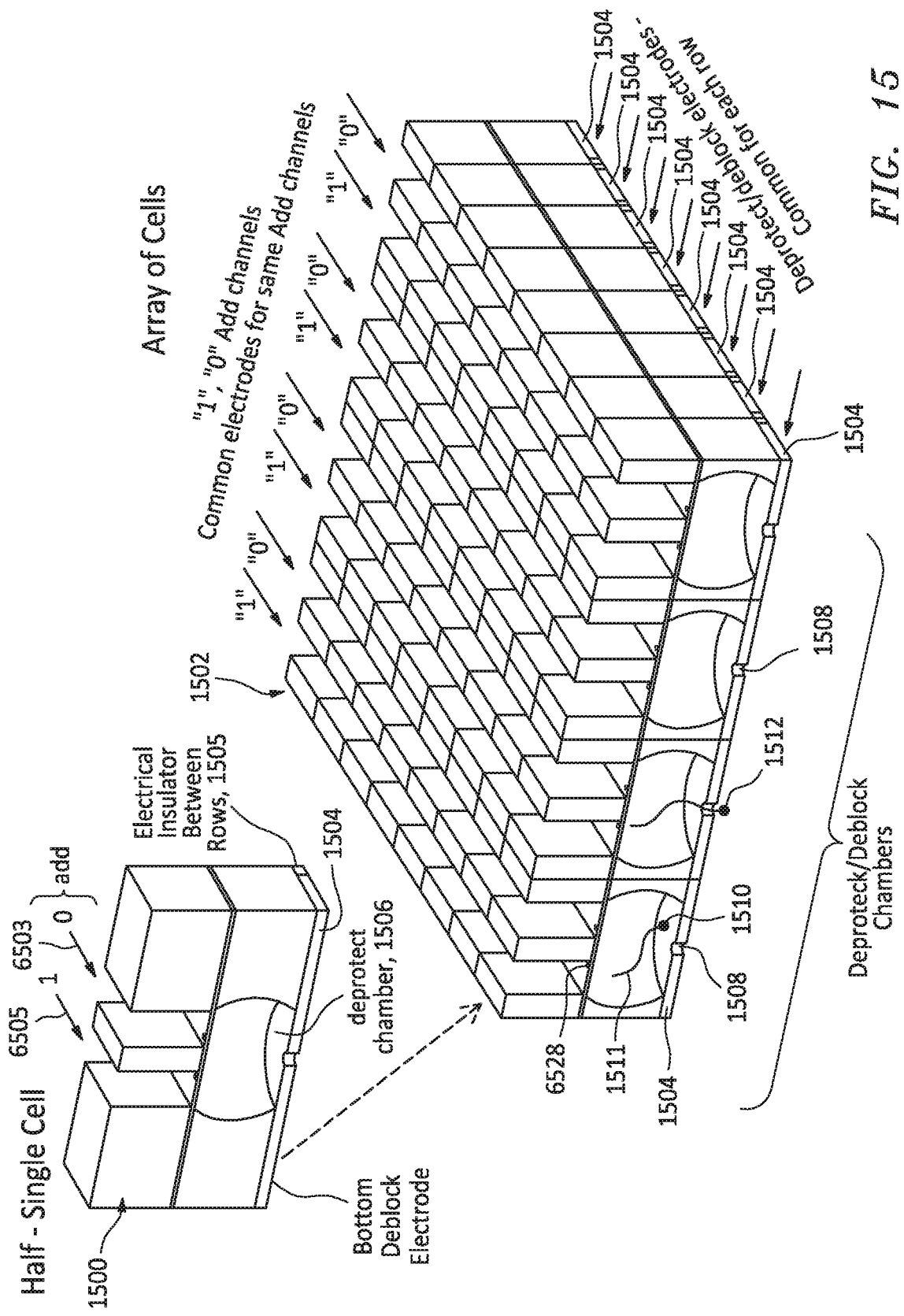
FIG. 15 is a perspective view of an array of cells and an enlargement of a half a single cell, in accordance with embodiments of the present disclosure.

Referring to FIG. 15, shows an embodiment of a single cell 1500 (shown as a half-cell cross-section for illustrative purposes), also shown and described as the memory cell 6702 in FIG. 1 herein, and an array of cells 1502, where the "1" add channels 6505 (FIG. 2) have a common electrode (not shown), and the "0" add channels 6503 (FIG. 2) have a common electrode (not shown), as discussed hereinbefore with FIG. 2. In this embodiment, the "deblock" (or "deprotect") chambers for each of the memory cells are fluidically isolated from each other, but each of the bottom rows (in this case, four deblock chambers in a row) have a common deblock/deprotect electrode 1504, each of the deblock rows being electrically (and fluidically) isolated from the adjacent row. An electrical insulator 1505 disposed along the length of the deblock electrode 1504 may be used to electrically isolated the rows of deblock electrodes 1504 from each other. In that case, each of the deblock chambers 1506 in a given row are addressed together using the common deblock electrode 1504 for that row. Such a configuration allows for an individual memory cell 1500 to be uniquely addressed (and thus control the DNA/polymer for writing or reading data) by selecting a given row (deblock rows) and a given column (add channels). The memory cell 1500 is shown in FIGS. 15 and 16 as a "half-cell" cross-section for illustrative purposes only, but when referred to herein is intended to reference an entire individual memory cell.

There is also a memory string (or DNA or polymer) loading hole 1508, e.g., a micro-sized hole (or "micro-hole") having a diameter of about 0.2 microns, in the bottom of each of the deprotect/deblock chambers (bottom chamber) to allow the initial strand of DNA (or polymer) to be inserted into the deblock chamber 1506. The micro-hole 1508 may be made large enough to also allow the DNA origami or bead 1510 (at one end of the DNA starter strand 1511) to pass through and then may be plugged after entry. Other sizes or diameters for the loading hole 1508 may be used if desired provided it provides the desired function and performance.

In some embodiments, the origami or beads 1510 attached to the starter DNA strand 6550 may be large enough to plug the bottom deblock chamber loading hole 1508, as shown by a large bead 1512, thereby providing both a tether (or attachment point) for the DNA and a plug to retain the liquid in the deblock chamber 1506. In some embodiments, the large beads 1512 may be magnetic, such that the large beads 1512 will fill (or plug) the loading holes 1508 in the presence of a magnetic field in an upward direction. The magnetic beads may also be used to remove the DNA memory strings from the holes 1508 after writing by the chip is complete, in the presence of a magnetic field in a downward direction, where the beads and the attached DNA memory strands or stings may be flowed away from the chip for separate storage.

Figure 16:
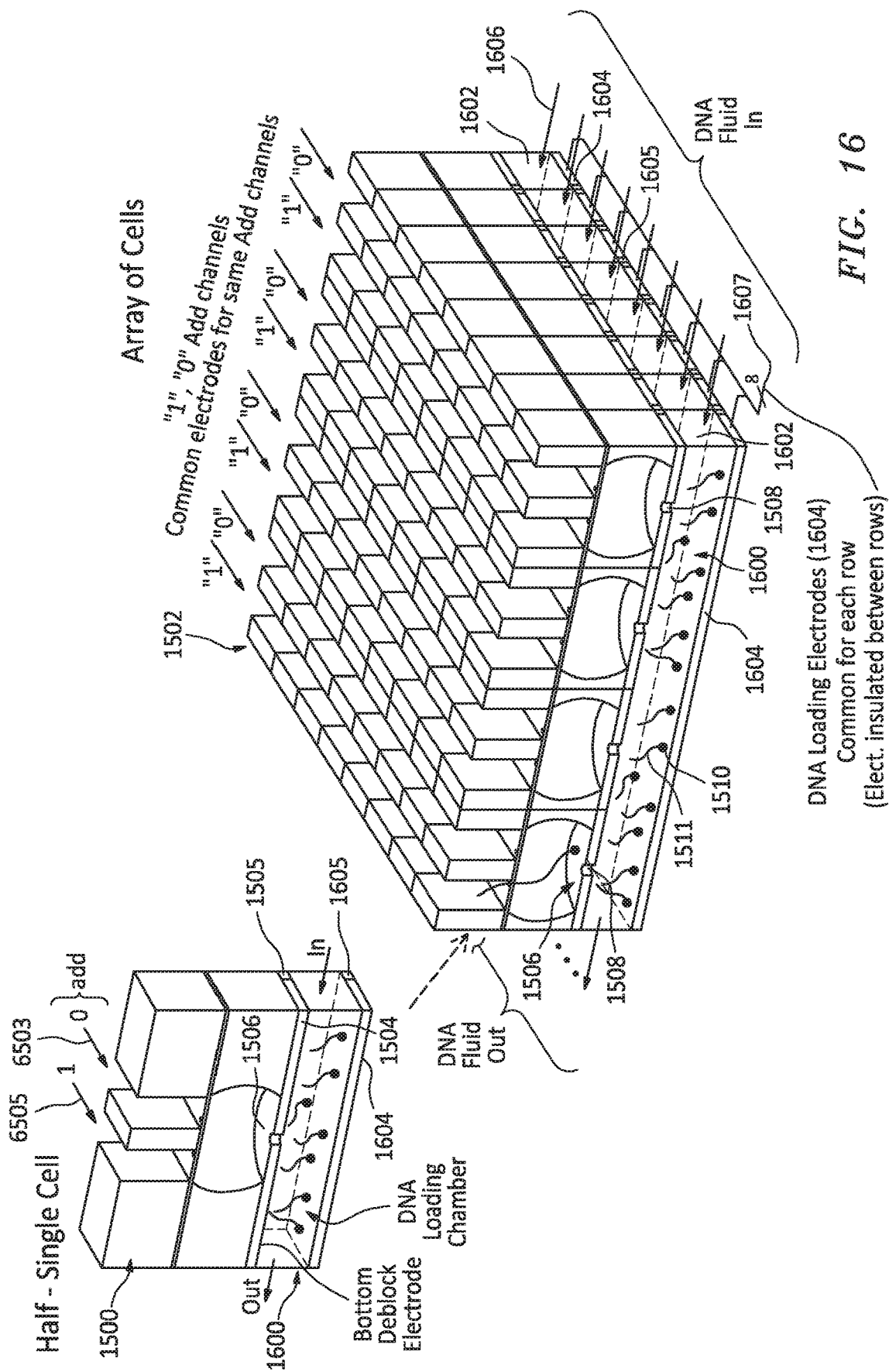
FIG. 16 shows the illustration of FIG. 15 having loading chambers disposed below the array and fluidically connected to deblock chambers of the cells, in accordance with embodiments of the present disclosure.

Referring to FIG. 16, in some embodiments, the array of cells 1502 of FIG. 15 may have a DNA (or polymer) loading chamber 1600 disposed under the deblock/deprotect chambers 1506. In some embodiments, the DNA loading chambers 1600 may be fluidic channels or rows (fluidically isolated from each other, but fluidically connected to the cells in that row). The loading chambers 1600 receive a loading fluid (or solution) containing an appropriate concentration of initial or starter DNA (or polymer) strings or strands (or memory strings) 1511 (and any corresponding origami or beads 1511 that may be attached thereto), that are added to when the memory cells store (or write) data onto the DNA (or polymer) memory strings. The DNA loading fluid has a concentration of DNA (or polymer) memory strings sufficient to load all the operational memory cells 1500 along that row with at least one starting DNA (or polymer) strand, and have sufficient additional strands as needed in the solution to provide the desired function and performance described herein. In some embodiments, the loading fluid may enter from one side (e.g., the right side) and exit from the other side (e.g., the left side) shown by the arrows 1606, and there may be the necessary fluids supply lines needed to supply the desired fluid at the appropriate times to achieve the desired loading conditions (discussed hereinafter).

Also, the DNA loading chamber rows (shown individually as 1602) each have a common loading electrode 1604, each of the loading chamber rows 1602 being electrically (and fluidically) isolated from the adjacent loading chamber row. Also, a collection of individual electrical wires (or leads or conductors) that may drive the loading electrodes 1604 is shown as 1607. An electrical insulator 1605 disposed along the length of the loading electrode 1604 may be used to electrically isolated the rows of loading electrodes 1504 from each other. In that case, all of the deblock chambers 1506 in a given row are addressed simultaneously for DNA loading using the common loading electrode 1604 for that loading chamber row. Such a configuration allows for an individual memory cell 1500 to be uniquely addressed (and thus loaded with a starter DNA) by selecting a given row (loading channels or rows) and a given column (add channels).

In some embodiments, the loading chamber 1600 may be a single fluidic chamber (not separate channels or rows), which is fluidically connected to each of the deblock chambers 1506 through the loading holes 1508 in the bottom of the deblock chambers 1506 of the memory cells in the cell array 1502. In the case of a single common loading chamber, the loading fluid may be provided by a single fluid feed (fluid in) line and a single fluid exit (fluid out) line, and there would be a single common loading electrode 1604 for all cells in the array (and no electrical insulation 1605 between rows). In that case, all cells would be affected by changes in the loading fluid and by changes in voltage applied to the common loading electrode.

In some embodiments, the loading chamber 1600 may be a fluidic chamber which is fluidically connected to individual cells, like the individual cell 1500 shown in the half-cell drawing, or a predetermined group of memory cells.

In some embodiments, the DNA loading chambers 1600 may be configured as a separate layer or fixture that the memory cell array 1502 attaches to, temporarily or detachably (for production loading purposes), or permanently. In the case of the loading chambers 1600 being a temporary detachable fixture, the fixture may have the necessary fluidic connections and interfaces to provide the DNA loading fluid to the loading chambers and to remove or flush-out the loading fluid (e.g., with a DNA/polymer-free buffer solution) from the loading chambers as needed. When used as a detachable fixture, when the memory cell array 1502 is removed from the DNA loading chamber fixture 1600, the bottom of the array may be sealed, e.g., by a silicone coating or other coating or adhesive cover or other cover to plug or seal the loading holes 1508 to prevent leakage or drying out of the fluid in the deblock chamber. In some embodiments, the bottom loading holes cover may be removable to allow extraction of the memory strings from the cell via the loading holes 1508 for storage of the memory strings in another storage container and/or another storage fluid/solution.

Figure 17:
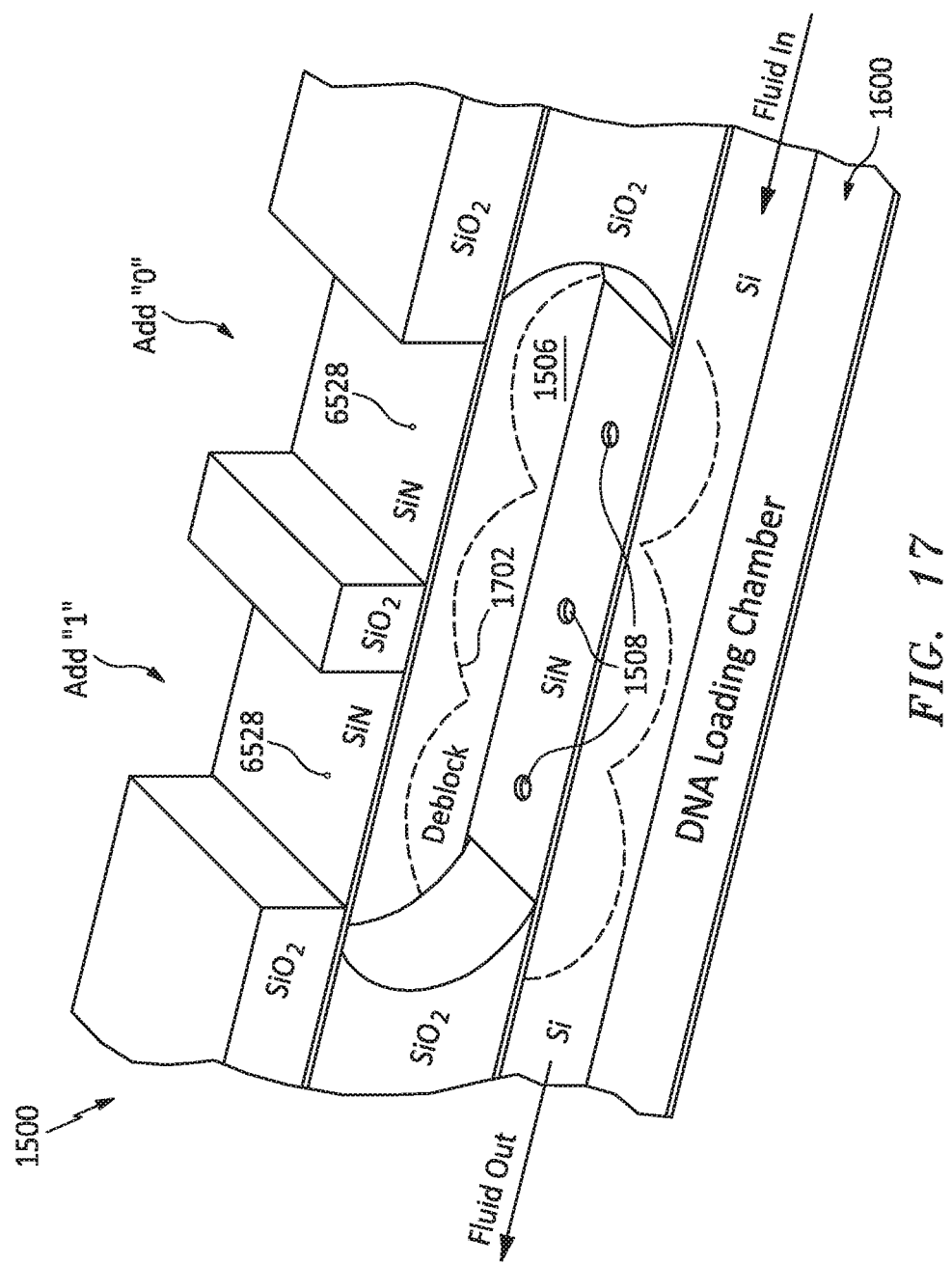
FIG. 17 is a perspective view of a memory cell having three micro-holes in the bottom of the deblock chamber and having a loading chamber disposed (detachably or fixedly) below the deblock chamber, in accordance with embodiments of the present disclosure.
Figure 18:
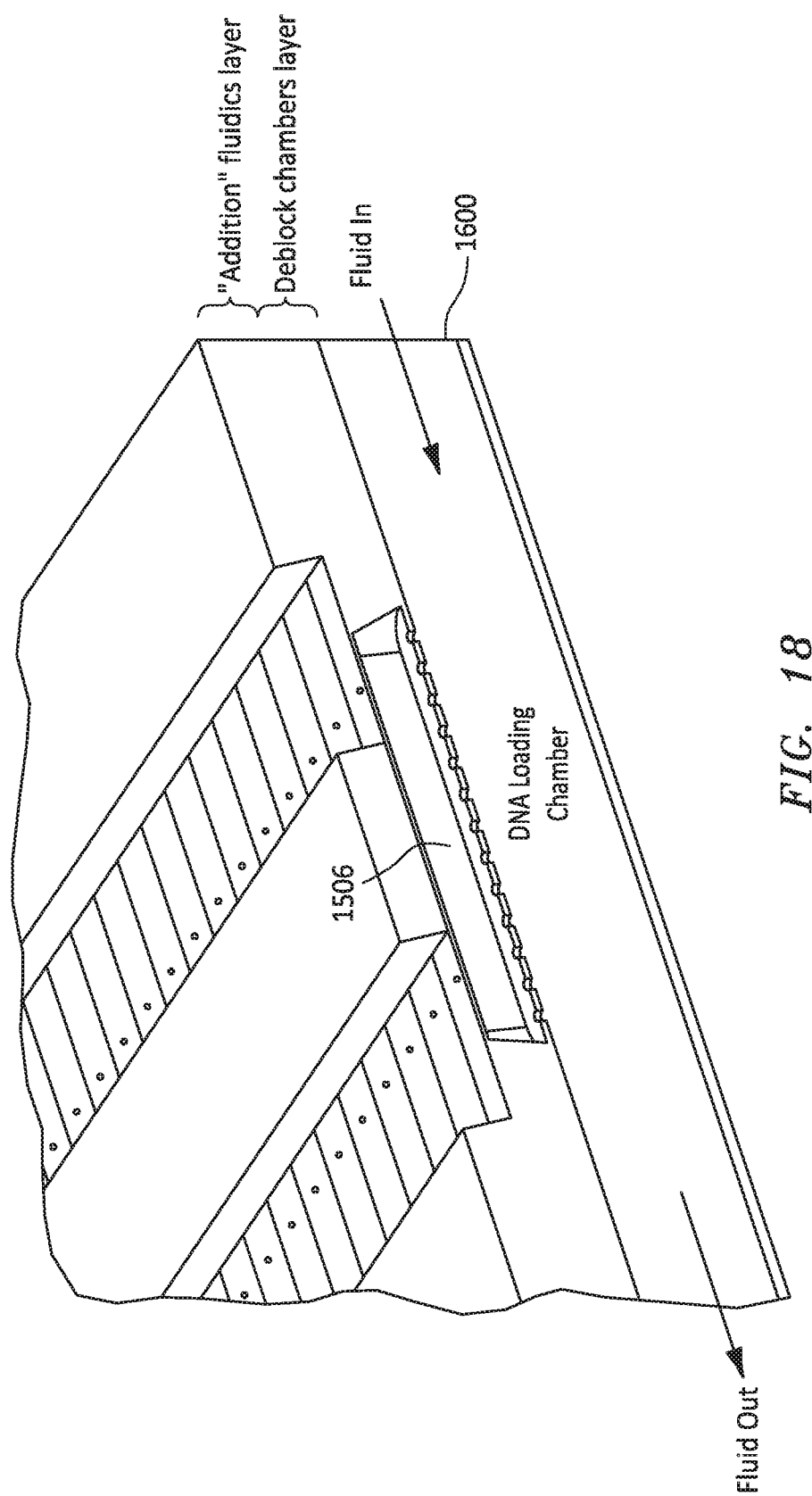
FIG. 18 is a perspective view of an array of memory cells having a plurality of micro-holes in the bottom of the deblock chamber and having a loading chamber disposed below the deblock chamber, in accordance with embodiments of the present disclosure.

Referring to FIGS. 17 and 18, in some embodiments, the memory cells 1500 of FIGS. 15 and 16 may have a plurality of loading holes 1508 on the bottom of the deblock chamber 1506, between the deblock chamber 1506 and the loading chamber 1600. For example, in FIG. 17, three loading holes 1508 are shown, and in FIG. 18, thirteen (13) loading holes are shown. Other numbers of loading holes may be used if desired. In FIG. 17, the rounded dashed lines 1702 indicate one possible 3D view of the result of an etching process used to create a longer deblock chamber 1506. The more loading holes 1508, the more entry passages that are available for the starter DNA strings to reach the deblock chamber from the loading chamber(s), which may decrease the time it takes for the DNA to load into the deblock chamber.

In some embodiments, it may be desirable to place at least two of the loading holes 1508 directly underneath the desired location of the nanopores 6528 in the upper Add chambers, as the nanopore may be fabricated through the larger (e.g., about 0.2 micron or 200 nm) loading holes 1508, e.g., using transmission electron microscope (TEM) electron beam drilling or other nanopore drilling techniques that can be fabricated by passing through the larger loading holes.

The starter DNA (or polymer) 1511 and any accompanying origami or bead 1510 attached thereto may be loaded by any process that causes the DNA to migrate into the deblock chamber 1506. For example, the starter DNA (or polymer) 1511 and any accompanying origami or bead 1510 attached thereto may be loaded using electric field forces (active loading), or using fluidic ionic salt gradients between deblock and loading chambers (passive loading), or by a combination of active and passive loading, or any other techniques.

Referring to FIG. 16, one technique using active electric field forces (active loading) is shown below for loading a single cell at a time using the matrix array of memory cells shown in FIG. 16:

1) Load DNA (or polymer) loading fluid into all of the DNA loading chamber rows 1600 (or at least the row of deblock chambers being loaded);
2) Apply a positive voltage to the first Add "1" channel (or column) and a negative voltage to the first row of the DNA loading row chambers 1602;
3) Simultaneously with step (2), apply a voltage more negative than that applied to the first row of the DNA loading chambers to all other Add "1" and Add "0" channels (or columns) and apply a positive voltage greater than that applied to the first Add "1" channel (or column) to all other loading row electrodes 1602 (to keep the DNA in other rows and columns from migrating into any of the un-addressed cells in those rows/columns);
4) When DNA is measured through the nanopore in the Add "1" channel of the cell in Row1/Column1, change all applied voltages to 0 volts (turn off applied voltages);
5) Repeat steps (1) to (4) for each of the Add "1" channels (or columns) for the number of deblock chambers in the loading channel row;
6) Repeat steps (1) to (5) for each of the rows of DNA loading row chambers until all cells are loaded.

Optionally, for any process used to load the memory cells in the array, when the loading chambers have fluidically isolated rows (as shown in FIG. 16), when all the cells (deblock chambers) in a given row are loaded, the loading fluid may be removed (i.e., fluidically rinsed) from that loading chamber row and replaced with a DNA-free buffer (or left dry) to reduce the risk of stray DNA capture or loaded DNA exit.

Also, for any of loading process using the memory cells described herein, the deblock electrode on the bottom of the deblock chamber may remain an open circuit or may be grounded or may be used with an active applied voltage provided it facilitates the migration of the starter DNA into the deblock chambers.

Instead of loading each cell individually, the cells may be loaded in groups, e.g., one loading chamber row at a time or one Add channel at a time. In that case, the common electrode for the row/column would remain active for DNA translocation through the nanopore, and the non-common electrodes for the opposite column/row would be deactivated (turned "off") when a DNA translocation is detected for that cell.

In particular, for example, to load all the memory cells in a given row, the following process may be used:
1) Load DNA (or polymer) loading fluid into all of the DNA loading row chamber channels 1600 (or at least the row of deblock chambers being loaded);
2) Apply a positive voltage to ALL the Add "1" channels (or columns) and a negative voltage to the first row of the DNA loading chamber rows 1602;
3) Simultaneously with step (2), apply a voltage more negative than that applied to the first row of the DNA loading chambers to all the Add "0" channels (or columns) and apply a positive voltage greater than that applied to the Add "1" channels (or columns) to all other loading row electrodes 1602 (to keep the DNA in other rows and columns from migrating into any of the un-addressed cells in those rows/columns);
4) When DNA is measured through the nanopore in ANY of the Add "1" channels associated with the memory cells in Row1, change the applied voltage to only that Add "1" channel to a voltage more negative than that applied to the first row of the DNA loading chamber rows (to stop DNA migration through the loading hole in that deblock chamber);
5) Repeat steps (1) to (4) until ALL of the Add "1" channels (or columns) have measured DNA through the nanopore for all of the deblock chambers in the loading channel row (all cells in row are loaded);
6) Repeat steps (1) to (5) for each of the rows of DNA loading chamber rows until all rows are loaded.

Similarly, to load all the memory cells in a given Add channel (column), the following process may be used:
1) Load DNA (or polymer) loading fluid into all of the DNA loading row chamber channels 1600;
2) Apply a positive voltage to the first Add "1" channel (or column) and a negative voltage to ALL the loading chamber rows 1600;
3) Simultaneously with step (2), apply a negative voltage greater than that applied to all of the loading chamber rows to all the Add "0" channels (or columns) and to all other Add "1" channels (or columns) (to keep the DNA in other rows and columns from migrating into any of the un-addressed cells in those rows/columns);
4) When DNA is measured through the nanopore in ANY of the cells associated with the Add "1" channel, change the applied voltage to only the row associated with that cell to a voltage more negative that that applied to the first row of the DNA loading chamber rows (to stop DNA migration through the loading hole in that deblock chamber);
5) Repeat steps (1) to (4) until ALL of the cells associated with that Add "1" channel (or column) have measured DNA through the nanopore for all of the deblock chambers in the Add channel (all the cells in an Add column are loaded);
6) Repeat steps (1) to (5) for each of the Add channels in the memory cell array until all the Add channels are loaded.

Instead of active electric field-based loading, the starter DNA (or polymer) and origami or bead may be loaded into the memory cells using a passive loading approach such as an ionic diffusion process, which uses fluidic ionic salt gradients between deblock and loading chambers to cause the DNA to migrate over time into the deblock chambers. In that case, the deblock chamber would be provided with a fluid that has a higher ionic concentration than the ionic concentration of the loading fluid. Over time, the ions in the deblock chamber will migrate into the lower concentration loading fluid, thereby causing the negatively charged DNA (or polymer) to migrate into the deblock chamber. This approach may also be coupled with an applied temperature or pressure variation of the cell and/or the loading chambers or loading fluids if desired, which may also be used alone without coupling with the above (ionic/salt) approach or in combination with any other approach (active or passive).

Instead of addressing and loading each cell individually (one at a time), the cells may be loaded by a "bulk" or "batch" or "shotgun" active loading approach where a positive voltage is applied to all the add electrodes simultaneously, or only the Add "1" electrodes and apply a negative voltage to the Add "0" electrodes, and apply a negative voltage to the loading chamber electrode(s), for a predetermined period of time, e.g., 3 second, or until one (or a predetermined number) of the nanopores in the Add channels of any memory cell registers DNA translocation or passage through the nanopore, and then turned all electrode voltages off or to 0 volts. In that case, a negative voltage may be applied to the loading electrodes for the same predetermined period of time, and then turned off to 0 volts. The predetermined time may be determined by modelling the memory cell and loading chamber(s) and fluid and DNA concentrations and determining a statistical average active diffusion time for DNA to enter the deblock chamber (or get close to the loading hole(s) or micro-holes 1508) and/or measured empirically by measuring the average diffusion time, in the presence of an electric field caused by voltage applied to the electrodes. For example, it may be determined that after 3 seconds for a given applied voltage difference across the memory cell, a given fluid in the Add chambers and loading chambers, and a given concentration of DNA (or polymers) in the loading fluid, that about 75% of the memory cells are loaded with a single starter DNA string, 10% of the cells have two or more DNA strings, and 15% of the cells have no DNA strings. In that case, the speed of loading may be worth having 10% bad cells and the ability to selectively load the remaining 15% of the cells.

In some embodiments, the cells may be loaded by a "bulk" or "batch" or "shotgun" passive loading approach using diffusion over time where no voltage is applied to any electrodes (e.g., turned all electrode voltages off or to 0 volts), and the system is observed for a predetermined period of time, e.g., 3 second, or until one of the nanopores in the Add channels of any memory cell registers DNA translocation or passage through the nanopore. The predetermined time may be determined by modelling the memory cell and loading chamber(s) and fluid and DNA concentrations and determining a statistical average passive diffusion time for DNA to enter the deblock chamber (or get close to the loading hole(s) 1508) and/or measured empirically by measuring the average diffusion time, without a voltage applied to the electrodes (purely passive diffusion). For purely passive loading, the loading efficiency may be modeled by a Poisson distribution, such as is described in the article: A. Basu, "*Digital Assays Part I: Partitioning Statistics and Digital PCR*", SLAS Technology 2017, Vol. 22(4) pp. 369-386, which is incorporated herein by reference to the extent necessary to understand the present disclosure. In that case, it would likely indicate that about 37% of the memory cells would load with a single DNA strand, about 37% of memory cells would have no DNA strands, and the remaining percentage of memory cells (about 26%) would have more than two strands.

In some cases, passive diffusion may cause the DNA to move close to the loading hole(s) 1508 of the deblock chamber, but additional forces may be required to help it enter the chamber through the loading hole(s) 1508, such as using and electric field (i.e., electrophoretic), or a salt gradient (discussed above), or a pressure difference, or a temperature difference or temperature cycling or another approach. In particular, a pressure (or pneumatic) difference and/or a temperature difference or temperature cycling may be used to provide additional forces to act on the DNA strands for it to enter the chamber/memory cell.

In some embodiments, a combination of both active and passive (hybrid) loading (for batch or individual cell or row/column-based or other loading) may also be used if desired. In that case, a voltage may be applied to get the DNA moving, but then shut off before any translocation occurs (or when only a few translocations have occurred), and allow passive diffusion to fill the remaining cells. Any other combination of active and passive loading may be used if desired to load the starter DNA strands into the memory cells.

For any of the above batch loading approaches, after the predetermined time, the loading chamber(s) may be rinsed to remove DNA from the fluid in the loading chamber, and the memory cells tested using active steering voltages applied to the Add channels electrodes and the Deblock electrode to determine which memory cells have one starter DNA string, which cells more than one starter DNA string, and which cells are empty. Once that is determined, loading fluid may be re-introduced to the loading chamber(s) and the empty cells may be loaded individually (or as a group) as discussed hereinabove, while not disturbing the properly loaded cells. The memory cells identified as having more than one DNA (polymer) string may be deemed inoperable and not used for memory storage, similar to a bad sector or region of conventional memory devices or chips.

In addition, the deblock chamber may be viewed like an "entropic capture chamber", such as that discussed in the article: Liu, et al., "*Entropic cages for trapping DNA near a nanopore*", Nature Communications, Feb. 4, 2015, which is incorporated herein by reference to the extent necessary to understand the present disclosure. In that case, the starter DNA (polymer) strands may enter the deblock chamber from the loading chamber using the approach or process discussed therein.

Any other loading processes may be used to load the starter DNA string and any accompanying origami or bead into the deblock chamber of the present disclosure provided it provides the desired function and performance requirements.

As discussed hereinbefore, in some embodiments, the present disclosure may use co-planar waveguides to implement certain of the resonator designs discussed herein. In that case, the AC frequency source excitation and AC response (or reflected or returned) signals may be configured using an impedance-match approach using a varactor-based tunable matching network, and a circulator and frequency mixer, such as is described in the article: Bhat, et al, "*Tank Circuit for Ultrafast Single-Particle Detection in Micropores*", Phys. Rev. Ltrs 121, 78102 (2018), which is incorporated herein by reference to the extent necessary to understand the present disclosure.

In some embodiments, the present disclosure provides a method of controlling the data bit rate of data stored on a polymer passing through a nanopore in a nanopore-based memory device, comprising: receiving a reference mean bit rate; receiving data bits read from the data stored on the polymer and determining a real-time instantaneous bit rate; calculating an actual mean bit rate based on the instantaneous bit rate; calculating a bit rate difference between the reference mean bit rate and the actual mean bit rate; and dynamically controlling a steering voltage which controls the data bit rate of data stored on the polymer passing through the nanopore, such that the actual mean bit rate is maintained substantially at the reference mean bit rate.

In some embodiments, the present disclosure provides the above method wherein the controlling the steering voltage is performed by dynamic control logic. In some embodiments, the present disclosure provides the above method wherein the dynamic control logic comprises at least one of: a proportional-integral (P-I), proportional, proportional-integral-derivative (P-I-D), low pass (LP), high pass (HP), bandpass (BP), quadratic ($2^{nd}$ order), linear, non-linear, lead/lag, and multi-order control. In some embodiments, the present disclosure provides the above method wherein the steering voltage creates an electric field which is proportional to velocity of the polymer passing through the nanopore. In some embodiments, the present disclosure provides the above method wherein data is stored in a nanopore polymer memory device, the device having an add "0" chamber, an add "1" chamber, and a "deblock" chamber. In some embodiments, the present disclosure provides the above method wherein the reference mean bit rate is set to a first value when the device is reading data and set to a second value when the device is writing data. In some embodiments, the present disclosure provides the above method wherein reference bit rate for reading data or writing data changes based on where along the polymer memory string the data is located when being read or written. In some embodiments, the present disclosure provides the above method wherein reference bit rate for reading data or writing data changes based on the digital data pattern stored on the polymer as it passes through the nanopore.

In some embodiments, the present disclosure provides a method of storing and reading digital data, comprising: providing a nanopore polymer memory device having at least one memory cell comprising at least two addition chambers each arranged to add a unique chemical construct (or codes) to a polymer (or DNA) string when the polymer enters the respective addition chamber, the data comprising a series of the codes; successively steering the polymer at a bit rate through the nanopore into the addition chambers to add the codes to the polymer to create the digital data pattern on the polymer; and accurately controlling the bit rate of the polymer using a servo controller.

In some embodiments, the present disclosure provides the above method further comprising steering the polymer through the nanopore at a read bit rate to read the codes on the polymer and wherein the controller controls the read bit rate of the polymer when reading the codes stored on the polymer. In some embodiments, the present disclosure provides the above method wherein the controller comprises dynamic control logic comprises at least one of: a proportional-integral (P-I), proportional, proportional-integral-derivative (P-I-D), low pass (LP), high pass (HP), bandpass (BP), quadratic ($2^{nd}$ order), linear, non-linear, lead/lag, and multi-order control. In some embodiments, the present disclosure provides the above method wherein the device comprises a plurality of memory cells and the servo controller controls the bit rate for each of the memory cells independently.

In some embodiments, the present disclosure provides a method of storing and retrieving data using a polymer, comprising: storing data in a nanopore polymer memory device, the device having an add "0" chamber, an add "1" chamber, and a "deblock" chamber, and the data being encoded as part of the storing process as raw stored data; retrieving the raw stored data from the nanopore memory cell; and processing the raw data to provide clean data for use by a user device.

In some embodiments, the present disclosure provides the above method further comprising receiving the clean data by the user device. In some embodiments, the present disclosure provides the above method wherein the use comprises at least one of accessing, reading, using, and storing the clean data. In some embodiments, the present disclosure provides the above method wherein the device comprises electrodes for moving the polymer between the chambers. In some embodiments, the present disclosure provides the above method wherein the processing the raw data comprises performing at least one of: error correction, special bit removal, decoding, decryption, and decompression. In some embodiments, the present disclosure provides the above method further comprising requesting the raw data or clean data be retrieved.

In some embodiments, the present disclosure provides a method for loading a polymer into a nanopore-based device, comprising: providing at least one memory cell, each cell having at least two add chambers each of the add chambers having a nanopore arranged to allow the polymer to enter and exit the add chamber from an adjacent deblock chamber, and each of the add chambers arranged to add a unique code to the polymer when the polymer enters the respective add chamber, the deblock chamber arranged to enable the polymer to receive the code when the polymer enters the respective add chamber and the deblock chamber having at least one loading hole in a side opposite from the nanopore; providing a loading chamber, fluidically connected to the deblock chamber via the at least one loading hole; loading the loading chamber with a loading fluid having the polymer; and loading the polymer from the loading chamber through the loading hole into the deblock chamber; and sealing the loading hole.

In some embodiments, the present disclosure provides the above method further comprising removing the loading fluid from the loading chamber. In some embodiments, the present disclosure provides the above method further comprising detaching the loading chamber from the deblock chamber after the loading. In some embodiments, the present disclosure provides the above method wherein the sealing is performed after the detaching. In some embodiments, the present disclosure provides the above method further comprising removing the loading chamber from the memory cell before being used to store data on the polymer. In some embodiments, the present disclosure provides the above method further comprising drilling the nanopores through the loading holes. In some embodiments, the present disclosure provides the above method wherein the drilling is performed using TEM electron drilling. In some embodiments, the present disclosure provides the above method wherein the memory cell and the loading chamber comprises electrodes for performing the loading of the polymer into the deblock chamber. In some embodiments, the present disclosure provides the above method wherein the loading chamber comprises a plurality of loading chamber rows, each loading chamber row fluidically connected to a row of deblock chambers. In some embodiments, the present disclosure provides the above method wherein the loading chamber comprises a single loading chamber fluidically connected to each of the deblock chambers in a plurality of memory cells. In some embodiments, the present disclosure provides the above method wherein the loading comprises at least one of: active loading and passive loading. In some embodiments, the present disclosure provides the above method wherein the loading comprises steering the polymer through the loading hole into the deblock chamber using electric field forces. In some embodiments, the present disclosure provides the above method wherein the device comprises a plurality of memory cells. In some embodiments, the present disclosure provides the above method further comprising after the loading, determining which memory cells have one polymer, more than one polymer, and no polymers. In some embodiments, the present disclosure provides the above method further comprising after the determining, loading memory strings into the memory cells with no polymers. In some embodiments, the present disclosure provides the above method wherein the passive loading comprises allowing the polymers in the loading chamber to passively load into the deblock chambers of the memory cell in the presence of an ionic salt gradient between fluid in the loading chamber and fluid in the deblock chamber. In some embodiments, the present disclosure provides the above method wherein the loading comprises loading the polymers into an array of memory cells via at least one of: one row at a time, one Add channel at a time, or one memory cell at a time.

In some embodiments, the present disclosure provides a method for storing data on a polymer in a nanopore-based device, comprising: providing a memory cell having at least three add chambers each of the add chambers having a nanopore arranged to allow the polymer to enter and exit the add chamber and each of the add chambers arranged to add a unique code to the polymer when the polymer enters the respective add chamber, and a "deblock" chamber arranged to enable the polymer to receive the code when the polymer enters the respective add chamber; and successively steering the polymer from the "deblock" chamber through the nanopore to the add chambers to add the codes to the polymer based on a predetermined digital data pattern to create the digital data pattern on the polymer.

In some embodiments, the present disclosure provides the above method further comprising reading the digital data pattern stored on the polymer as it passes through the nanopore. In some embodiments, the present disclosure provides the above method wherein the device comprises electrodes for performing the steering of the polymer. In some embodiments, the present disclosure provides the above method wherein the device comprises a plurality of memory cells. In some embodiments, the present disclosure provides the above method wherein the number of unique codes for each memory cell is an integer greater than 2. In some embodiments, the present disclosure provides the above method wherein the number of unique codes for each memory cell is a binary number greater than 2. In some embodiments, the present disclosure provides the above method wherein the number of unique codes for each memory cell is: 4, 8, 16, 32, 64, 128, 256, 512, 1024, 2048, 4096, 8192, 16384, 32768, or 65536. In some embodiments, the present disclosure provides the above method wherein each code is indicative of a digit in a word, the digit having a Base-N based on the number of unique codes, and the word having a length M based on the number of digits. In some embodiments, the present disclosure provides the above method wherein the number of unique codes for each memory cell is determined by the number of operational add-chambers (automatically and in real-time).

In some embodiments, the present disclosure provides a method of storing data using a polymer, comprising: providing a nanopore polymer memory device having at least one memory cell comprising at least three addition chambers, each of the addition chambers arranged to add a unique code to the polymer when the polymer enters the respective addition chamber, the data comprising a series of the codes having a number of data states corresponding to the number of unique codes; and successively steering the polymer through the nanopore into the addition chambers to add the codes to the polymer based on a predetermined digital data pattern to create the digital data pattern on the polymer.

In some embodiments, the present disclosure provides the above method further comprising reading the digital data pattern stored on the polymer as it passes through the nanopore. In some embodiments, the present disclosure provides the above method wherein the device comprises electrodes for performing the steering of the polymer. In some embodiments, the present disclosure provides the above method wherein the device comprises a plurality of memory cells. In some embodiments, the present disclosure provides the above method wherein the number of unique codes for each memory cell is an integer greater than 2. In some embodiments, the present disclosure provides the above method wherein the number of unique codes for each memory cell is a binary number greater than 2. In some embodiments, the present disclosure provides the above method wherein the number of unique codes for each memory cell is: 4, 8, 16, 32, 64, 128, 256, 512, 1024, 2048, 4096, 8192, 16384, 32768, or 65536. In some embodiments, the present disclosure provides the above method wherein each code is indicative of a digit in a word, the digit having a Base-N based on the number of unique codes, and the word having a length M based on the number of digits. In some embodiments, the present disclosure provides the above method wherein the code is indicative of a multi-bit binary digital code. In some embodiments, the present disclosure provides the above method wherein the number of unique codes for each memory cell is automatically determined in real-time by the number of operational add-chambers.

The system, computers, servers, devices and the like described herein have the necessary electronics, computer processing power, interfaces, memory, hardware, software, firmware, logic/state machines, databases, microprocessors, communication links (wired or wireless), displays or other visual or audio user interfaces, printing devices, and any other input/output interfaces, to provide the functions or achieve the results described herein. Except as otherwise explicitly or implicitly indicated herein, process or method steps described herein may be implemented within software modules (or computer programs) executed on one or more general-purpose computers. Specially designed hardware may alternatively be used to perform certain operations. Accordingly, any of the methods described herein may be performed by hardware, software, or any combination of these approaches. In addition, a computer-readable storage medium may store thereon instructions that when executed by a machine (such as a computer) result in performance according to any of the embodiments described herein.

In addition, computers or computer-based devices described herein may include any number of computing devices capable of performing the functions described herein, including but not limited to: tablets, laptop computers, desktop computers, smartphones, mobile communication devices, smart TVs, set-top boxes, e-readers/players, and the like.

Although the disclosure has been described herein using exemplary techniques, algorithms, or processes for implementing the present disclosure, it should be understood by those skilled in the art that other techniques, algorithms and processes or other combinations and sequences of the techniques, algorithms and processes described herein may be used or performed that achieve the same function(s) and result(s) described herein and which are included within the scope of the present disclosure.

Any process descriptions, steps, or blocks in process or logic flow diagrams provided herein indicate one potential implementation, do not imply a fixed order, and alternate implementations are included within the scope of the preferred embodiments of the systems and methods described herein in which functions or steps may be deleted or performed out of order from that shown or discussed, including substantially concurrently or in reverse order, depending on the functionality involved, as would be understood by those reasonably skilled in the art.

It should be understood that, unless otherwise explicitly or implicitly indicated herein, any of the features, functions, characteristics, alternatives or modifications described regarding a particular embodiment herein may also be applied, used, or incorporated with any other embodiment described herein. Also, the drawings herein are not drawn to scale, unless indicated otherwise.

Conditional language, such as, among others, "can," "could," "might," or "may," unless specifically stated otherwise, or otherwise understood within the context as used, is generally intended to convey that certain embodiments could include, but do not require, certain features, elements, or steps. Thus, such conditional language is not generally intended to imply that features, elements, or steps are in any way required for one or more embodiments or that one or more embodiments necessarily include logic for deciding, with or without user input or prompting, whether these features, elements, or steps are included or are to be performed in any particular embodiment.

Although the invention has been described and illustrated with respect to exemplary embodiments thereof, the foregoing and various other additions and omissions may be made therein and thereto without departing from the spirit and scope of the present disclosure.

The invention claimed is:

1. A method of controlling the data bit rate of data stored on a polymer passing through a nanopore in a nanopore-based memory device, comprising:
   receiving a reference mean bit rate;
   receiving data bits read from the data stored on the polymer and determining a real-time instantaneous bit rate;
   calculating an actual mean bit rate based on the instantaneous bit rate;
   calculating a bit rate difference between the reference mean bit rate and the actual mean bit rate; and
   dynamically controlling a steering voltage which controls the data bit rate of data stored on the polymer passing through the nanopore, such that the actual mean bit rate is maintained substantially at the reference mean bit rate.

2. The method of claim 1, wherein the controlling the steering voltage is performed by dynamic control logic.

3. The method of claim 1, wherein the dynamic control logic comprises at least one of: a proportional-integral (P-I), proportional, proportional-integral-derivative (P-I-D), low pass (LP), high pass (HP), bandpass (BP), quadratic (2$^{nd}$ order), linear, non-linear, lead/lag, and multi-order control.

4. The method of claim 1, further comprising accurately controlling the bit rate of the polymer using a servo controller.

5. The method of claim 4 further comprising steering the polymer through the nanopore at a read bit rate to read the codes on the polymer and wherein the controller controls the read bit rate of the polymer when reading the codes stored on the polymer.

6. The method of claim 4 wherein the device comprises a plurality of memory cells and the servo controller controls the bit rate for each of the memory cells independently.

7. A method of storing and retrieving data using a polymer, comprising:
    storing data in a nanopore polymer memory device, the device having an add "0" chamber, an add "1" chamber, and a "deblock" chamber, and the data being encoded as part of the storing process as raw stored data;
    retrieving the raw stored data from the nanopore memory cell; and
    processing the raw data to provide clean data for use by a user device.

8. The method of claim 7 further comprising receiving the clean data by the user device.

9. The method of claim 7 wherein the use comprises at least one of accessing, reading, using, and storing the clean data.

10. The method of claim 7 further comprising requesting the raw data or clean data be retrieved.

11. A method for loading a polymer into a nanopore-based device, comprising:
    providing at least one memory cell, each cell having at least two add chambers each of the add chambers having a nanopore arranged to allow the polymer to enter and exit the add chamber from an adjacent deblock chamber, and each of the add chambers arranged to add a unique code to the polymer when the polymer enters the respective add chamber, the deblock chamber arranged to enable the polymer to receive the code when the polymer enters the respective add chamber and the deblock chamber having at least one loading hole in a side opposite from the nanopore;
    providing a loading chamber, fluidically connected to the deblock chamber via the at least one loading hole;
    loading the loading chamber with a loading fluid having the polymer; and
    loading the polymer from the loading chamber through the loading hole into the deblock chamber; and
    sealing the loading hole.

12. The method of claim 11 further comprising removing the loading fluid from the loading chamber.

13. The method of claim 11 further comprising detaching the loading chamber from the deblock chamber after the loading.

14. The method of claim 11 wherein the sealing is performed after the detaching.

15. The method of claim 11 wherein the loading comprises at least one of: active loading and passive loading.

16. A method for storing data on a polymer in a nanopore-based device, comprising:
    providing a memory cell having at least three add chambers each of the add chambers having a nanopore arranged to allow the polymer to enter and exit the add chamber and each of the add chambers arranged to add a unique code to the polymer when the polymer enters the respective add chamber, and a "deblock" chamber arranged to enable the polymer to receive the code when the polymer enters the respective add chamber; and
    successively steering the polymer from the "deblock" chamber through the nanopore to the add chambers to add the codes to the polymer based on a predetermined digital data pattern to create the digital data pattern on the polymer.

17. The method of claim 16, wherein the number of unique codes for each memory cell is a binary number greater than 2.

18. The method of claim 16, wherein the number of unique codes for each memory cell is: 4, 8, 16, 32, 64, 128, 256, 512, 1024, 2048, 4096, 8192, 16384, 32768, or 65536.

19. The method of claim 16, wherein each code is indicative of a digit in a word, the digit having a Base-N based on the number of unique codes, and the word having a length M based on the number of digits.

20. The method of claim 16, wherein the number of unique codes for each memory cell is automatically determined in real-time by the number of operational add-chambers.

* * * * *